(12) United States Patent
Kumar et al.

(10) Patent No.: US 10,687,434 B2
(45) Date of Patent: Jun. 16, 2020

(54) MECHANISMS FOR SAS-FREE CABLING IN RACK SCALE DESIGN

(71) Applicant: INTEL CORPORATION, Santa Clara, CA (US)

(72) Inventors: Mohan J. Kumar, Aloha, OR (US); Murugasamy K. Nachimuthu, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 370 days.

(21) Appl. No.: 15/395,855

(22) Filed: Dec. 30, 2016

(65) Prior Publication Data

US 2018/0192540 A1 Jul. 5, 2018

(51) Int. Cl.
*G06F 15/177* (2006.01)
*H05K 7/14* (2006.01)
*G06F 3/06* (2006.01)

(52) U.S. Cl.
CPC ......... *H05K 7/1492* (2013.01); *G06F 3/0605* (2013.01); *G06F 3/067* (2013.01); *G06F 3/0631* (2013.01); *G06F 3/0644* (2013.01); *G06F 3/0689* (2013.01)

(58) Field of Classification Search
USPC ................ 709/220, 224, 225, 227, 228, 230
See application file for complete search history.

*Primary Examiner* — Lan Dai T Truong
(74) *Attorney, Agent, or Firm* — Law Office of R. Alan Burnett, P.S.

(57) ABSTRACT

Mechanisms for SAS-free cabling in Rack Scale Design (RSD) environments and associated methods, apparatus, and systems. Pooled compute drawers containing multiple compute nodes are coupled to pooled storage drawers using fabric infrastructure, such as Ethernet links and switches. The pooled storage drawers includes a storage distributor that is coupled to a plurality of storage devices and includes one or more fabric ports and a PCIe switch with multiple PCIe ports. Under one configuration, the PCIe ports are connected to one or more IO hubs including a PCIe switch coupled to multiple storage device interfaces that are coupled to the storage devices. In another configuration, the PCIe ports are connected directly to PCIe storage devices. The storage distributor implements a NVMe-oF server driver that interacts with an NVMe-oF client driver running on compute nodes or a fabric switch. The drivers logically couple the storage devices over the fabric infrastructure to the compute nodes in a manner that appears the storage devices are local devices.

25 Claims, 18 Drawing Sheets

MECHANISMS FOR SAS-FREE CABLING IN RACK SCALE DESIGN

BACKGROUND INFORMATION

The availability and use of "Cloud" computing has expanded exponentially in the past few years. Under a conventional computing approach, users run software applications on their own computers and/or access software services hosted by local servers (such as servers run by a business enterprise). In contrast, under cloud computing the compute and storage resources are "in the cloud," meaning they are physically hosted at a remote facility that is accessed via a computer network, such as the Internet. Compute and storage resources hosted by a cloud operator may be accessed via "services," where are commonly referred to as cloud-based services, Web services or simply services.

Cloud-based services are typically hosted by a datacenter that includes the physical arrangement of servers that make up a cloud or a particular portion of a cloud. Data centers commonly employ a physical hierarchy of compute, network and storage shared resources to support scale out of workload requirements. FIG. 1 shows a portion of an exemplary physical hierarchy in a data center 100 including a number L of pods 102, a number M of racks 104, each of which includes slots for a number N of trays 106. Each tray 106, in turn, may include multiple sleds 108. For convenience of explanation, each of pods 102, racks 104, and trays 106 is labeled with a corresponding identifier, such as Pod 1, Rack 2, Tray 1B, etc. Trays may also be referred to as drawers, and sleds may also have various forms, such as modules. In addition to tray and sled configurations, racks may be provisioned using chassis in which various forms of servers are installed, such as blade server chassis and server blades.

Depicted at the top of each rack 104 is a respective top of rack (ToR) switch 110, which is also labeled by ToR Switch number. Generally, ToR switches 110 are representative of both ToR switches and any other switching facilities that support switching between racks 104. It is conventional practice to refer to these switches as ToR switches whether or not they are physically located at the top of a rack (although they generally are).

Each Pod 102 further includes a pod switch 112 to which the pod's ToR switches 110 are coupled. In turn, pod switches 112 are coupled to a data center (DC) switch 114. The data center switches may sit at the top of the data center switch hierarchy, or there may be one or more additional levels that are not shown. For ease of explanation, the hierarchies described herein are physical hierarchies that use physical LANs. In practice, it is common to deploy virtual LANs using underlying physical LAN switching facilities.

Recently, Intel® Corporation introduced new rack architecture called Rack Scale Design (RSD) (formerly called Rack Scale Architecture). Rack Scale Design is a logical architecture that disaggregates compute, storage, and network resources and introduces the ability to pool these resources for more efficient utilization of assets. In contrast to the conventional rack architecture shown in FIG. 1, resources from multiple racks may be dynamically composed to form compute nodes based on workload-specific demands. In addition, communication between components in different racks is facilitated through use of Serial Attached SCSI (SAS) cabling between the racks, which are connected by hand, with different rack configurations requiring different SAS cabling configurations. If the SAS cabling is miswired, resources in an RSD rack may be unavailable. In addition, SAS cables are expensive and large numbers of cables may create other problems and are an eyesore. SAS cables also have limited redix.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

Figure 1:
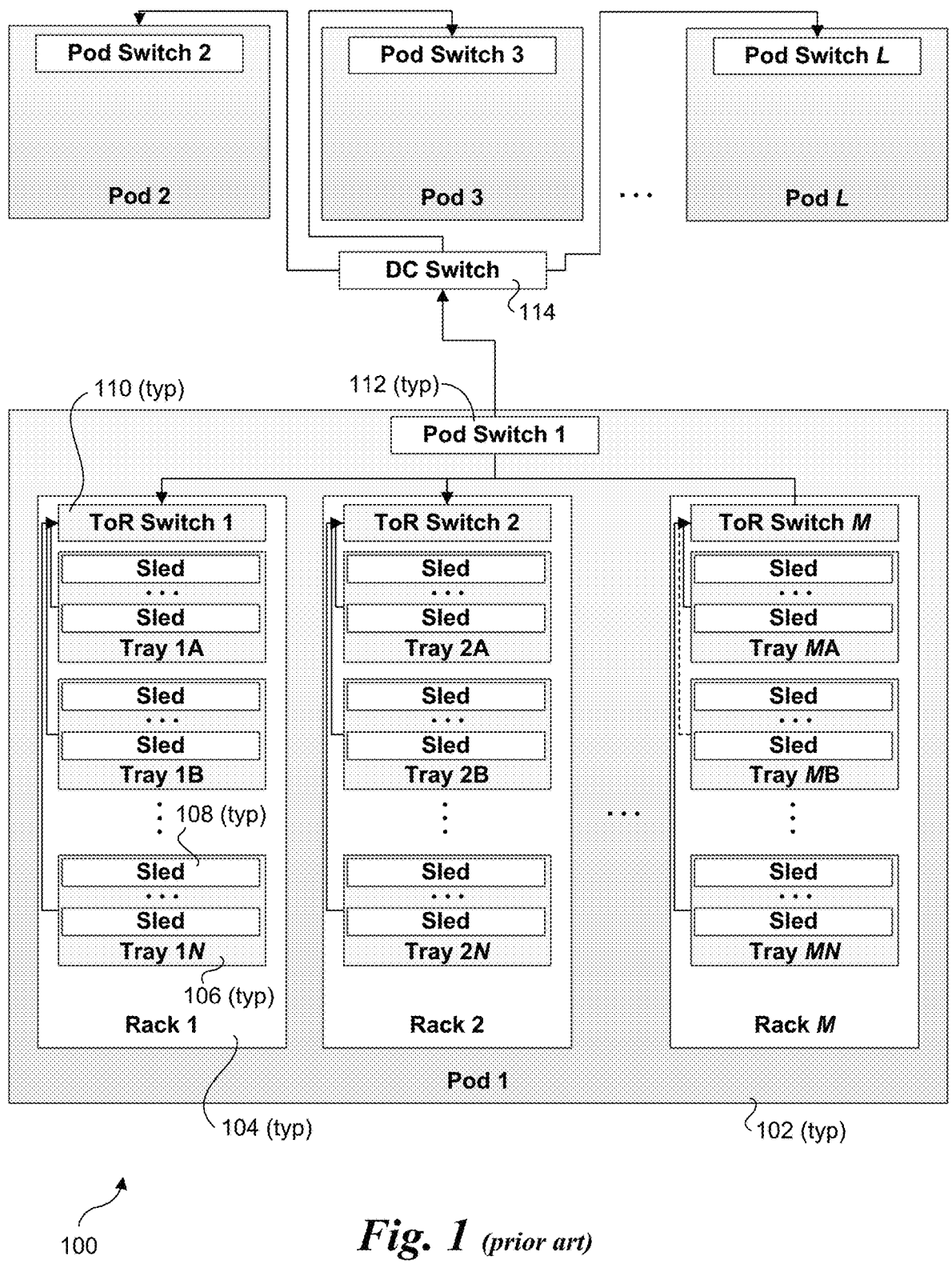
FIG. 1 is a schematic diagram of a conventional physical rack configuration in a data center.

Mechanisms for SAS-free cabling in Rack Scale Design environments and associated methods, apparatus, and systems are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

Intel® Rack Scale Design uses compute, fabric, storage, and management modules that work together to enable selectable configuration of a wide range of virtual systems. The design uses four basic pillars, which can be configured based on the user needs. These include 1) a Pod Manager for multi-rack management, comprising firmware and software APIs that enable resource and policy management and expose the hardware below and the orchestration layer above via a standard interface; 2) a Pooled system of compute, network, and storage resources that may be selectively composed based on workload requirements; 3) Pod-wide storage built on connected storage uses storage algorithms to support a range of usages deployed as a multi-rack resource or storage hardware and compute nodes with local storage; and 4) a configurable network fabric of hardware, interconnect with cables and backplanes, and management software to support a wide range of cost-effective network topologies, including current top-of-rack switch designs and distributed switches in the platforms.

Figure 2:
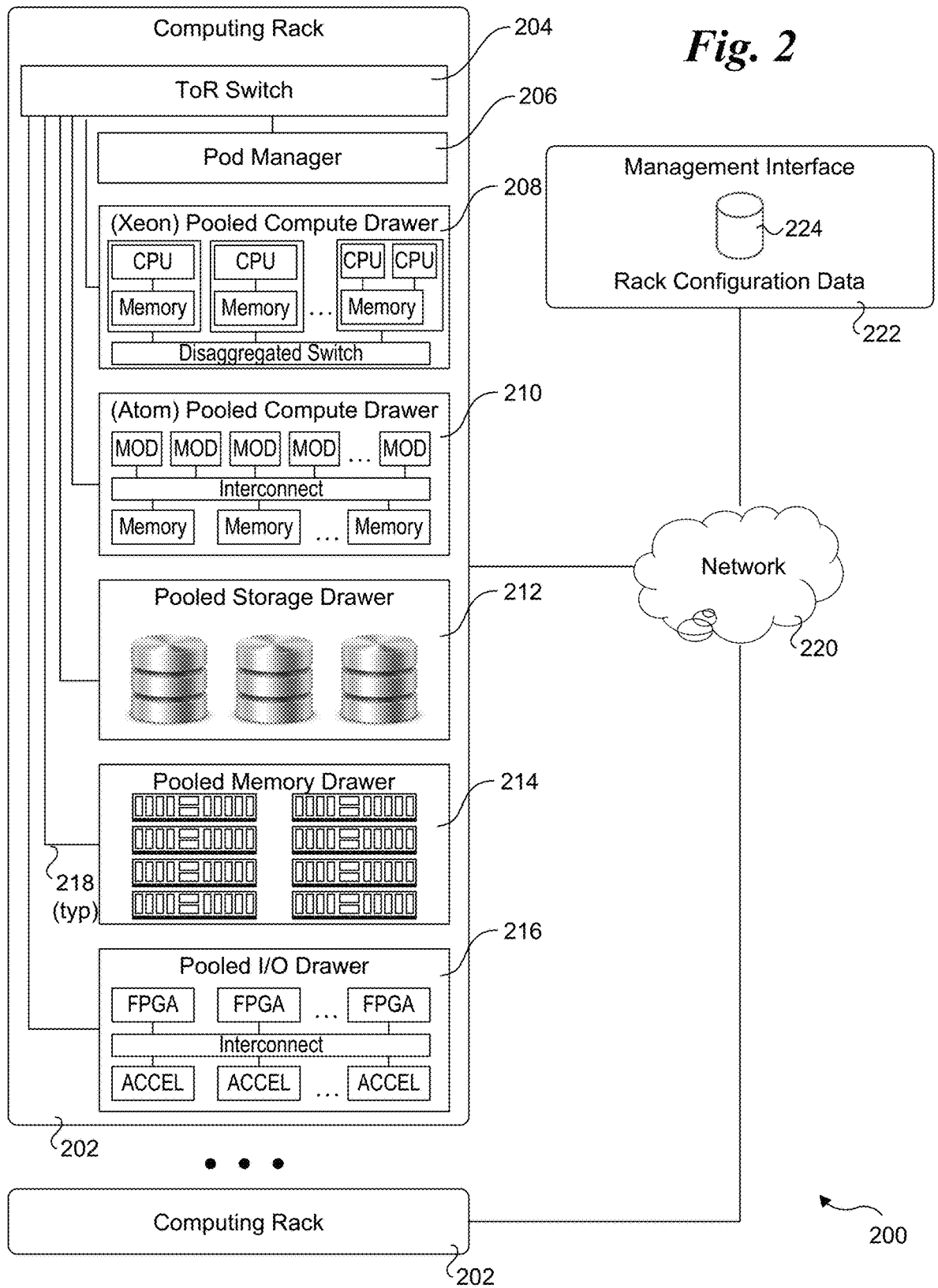
FIG. 2 is a schematic diagram of a Rack Scale Design (RSD) configuration in a data center, according to one embodiment.

An exemplary RSD environment 200 is illustrated in FIG. 2. RSD environment 200 includes multiple computing racks 202, each including a ToR switch 204, a pod manager 206, and a plurality of pooled system drawers. Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an Intel® Xeon® pooled computer drawer 208, and Intel® Atom® pooled compute drawer 210, a pooled storage drawer 212, a pooled memory drawer 214, and an pooled I/O drawer 216. Each of the pooled system drawers is connected to ToR switch 204 via a high-speed link 218, such as a 40 Gigabit/second (Gb/s) or 100 Gb/s Ethernet link or an 100+Gb/s Silicon Photonics (SiPh) optical link. In one embodiment high-speed link 218 comprises an 800 Gb/s SiPh optical link.

Multiple of the computing racks 200 may be interconnected via their ToR switches 204 (e.g., to a pod-level switch or data center switch), as illustrated by connections to a network 220. In some embodiments, groups of computing racks 202 are managed as separate pods via pod manager(s) 206. In one embodiment, a single pod manager is used to manage all of the racks in the pod. Alternatively, distributed pod managers may be used for pod management operations.

RSD environment 200 further includes a management interface 222 that is used to manage various aspects of the RSD environment. This includes managing rack configuration, with corresponding parameters stored as rack configuration data 224.

Figure 3:
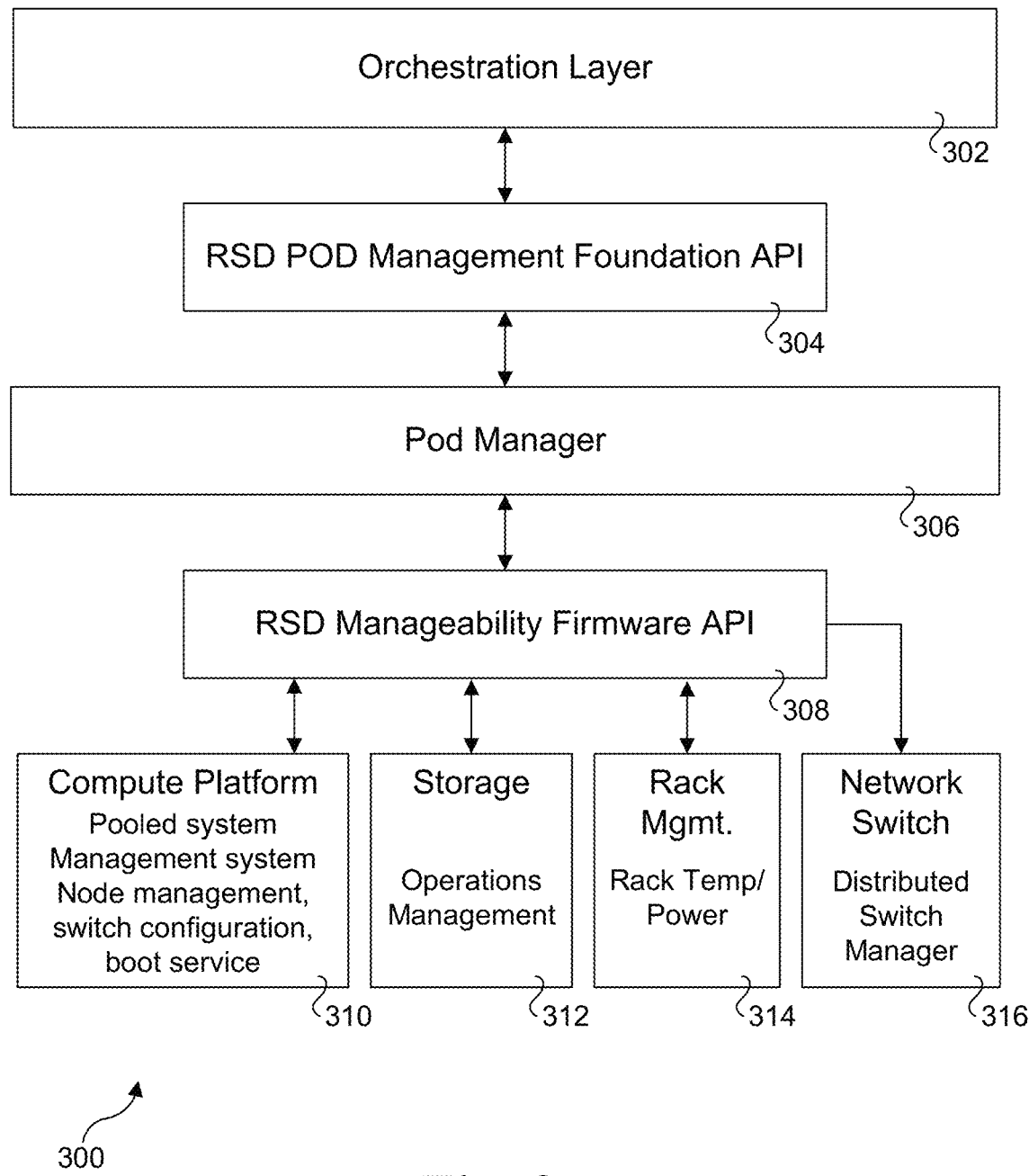
FIG. 3 is a block diagram an RSD management architecture, according to one embodiment.

FIG. 3 shows one embodiment of a RSD management architecture 300. The RSD management architecture includes multiple software and firmware components configured in a layered architecture including an orchestration layer 302, an RSD pod management foundation API (Application Program Interface), a pod manager 306, and an RSD manageability firmware API 308. The bottom layer of RSD management architecture includes a compute platform management component 310, a storage management component 312, a, a rack management components 314, and a network switch management component 316.

The compute platform management component 310 performs operations associated with compute drawers and includes a pooled system, a management system, node management, switch configuration, and boot service. Storage management component 312 is configured to support operation management of pooled storage drawers. Rack management component 314 is configured to manage rack temperature and power sub-systems. Network switch management component includes a distributed switch manager.

Intel® Rack Scale Design is designed to change the focus of platform architecture from single servers to converged infrastructure consisting of compute, network and storage, as discussed above and illustrated in FIG. 2. Management of resources is performed at the rack level and pod level. Focus on management of resources at the rack level also requires management of rack level environments such as power and cooling zones as well as providing a rack level root of trust for relative location information. This role is fulfilled by Rack Management Module (RMM), along with a sub-rack unit (the drawer units in RSD terminology) manager called a Pooled System Management Engine (PSME). The management elements of RSD, RMM and PSMEs are connected to a private network that is not accessible external to the rack.

Figure 4:
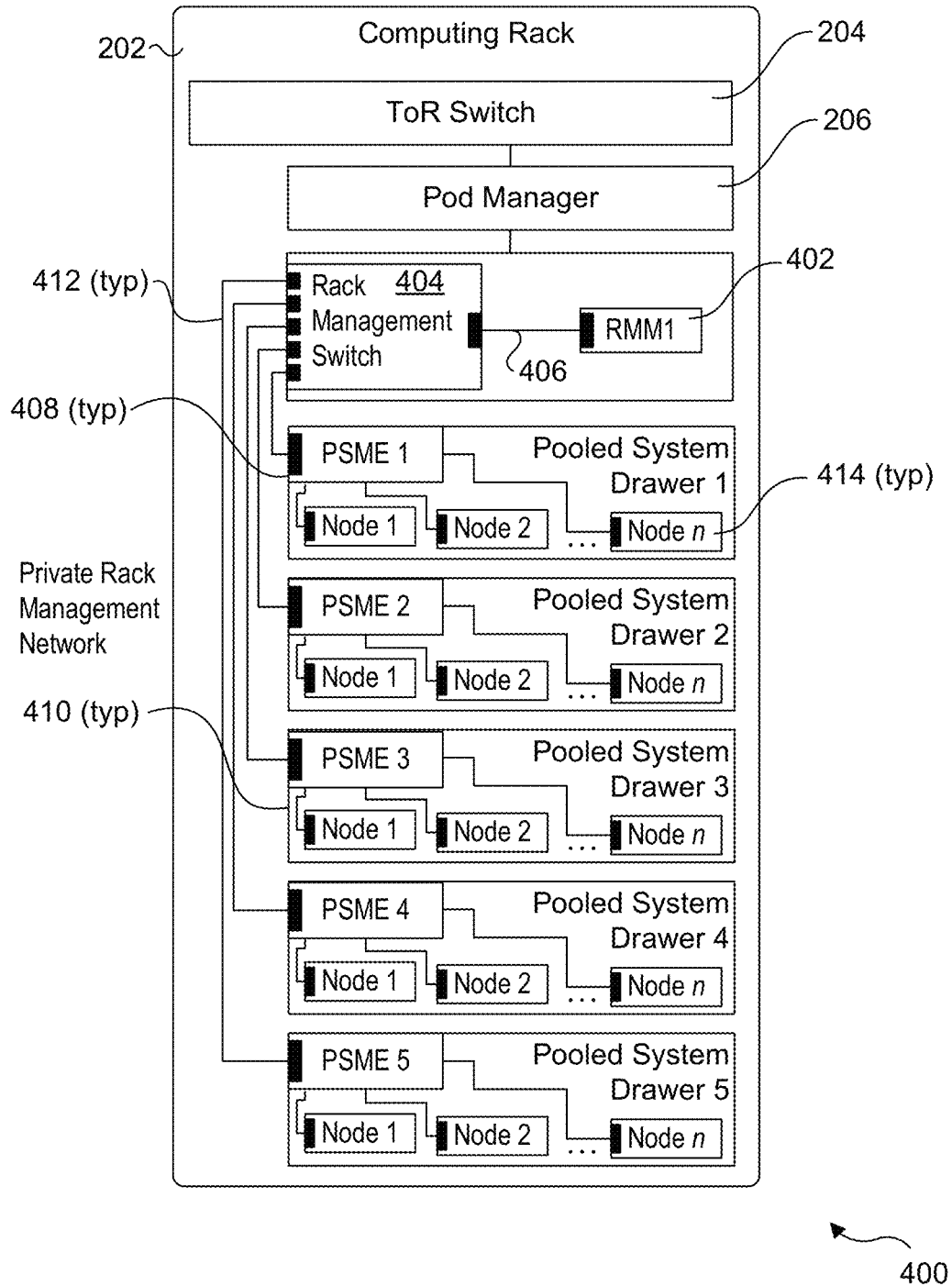
FIG. 4 is a schematic diagram showing further details of an RSD rack implementing Pooled System Management Engines.

For example, FIG. 4 shows one embodiment of a rack configuration 400 employing rack management and configuration components that communicate over a private rack management network. The rack management and configuration components include an RMM 402 coupled in communication with a rack management switch 404 via a link 406. A respective PSME 408 is associated with each of five pooled system drawers 410. Each PSME 408 is connected to rack management switch 404 via a link 412. The rack management switch is also connected to POD Manager 206. In one embodiment, the private rack management network employs Ethernet links.

Figure 5:
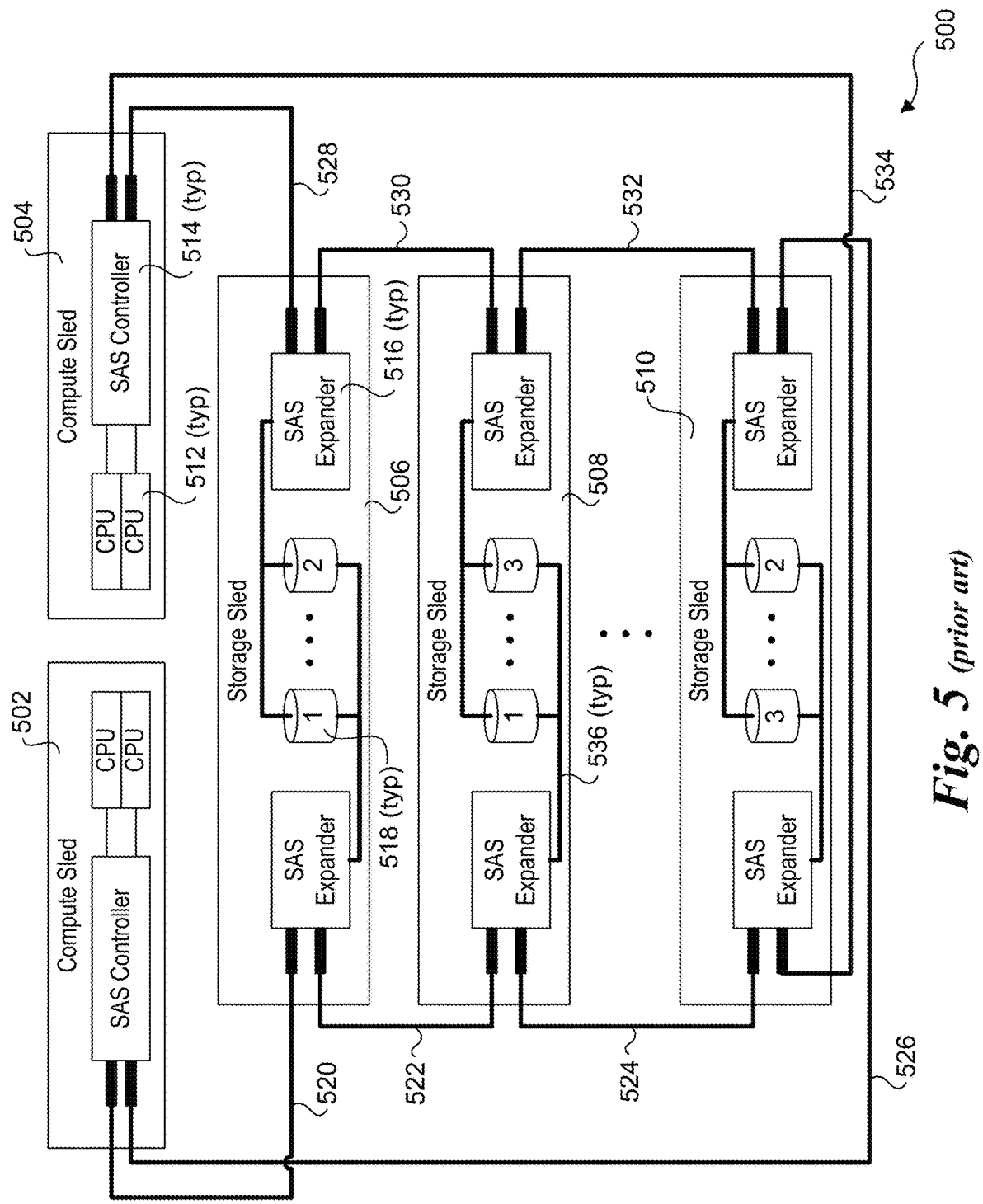
FIG. 5 is a schematic diagram illustrating the use of SAS cables for connecting storage devices to compute sleds.

FIG. 5 shows a rack architecture 500 that employs SAS cables for connecting compute resources to storage resources. Rack architecture 500 includes a pair of compute sleds 502 and 504, and multiple storage sleds, depicted as storage sleds 506, 508 and 510. Each compute sled includes one or more servers, depicted as CPUs 512. Each compute sled also includes an SAS controller 514. Each storage sled includes a pair of SAS expanders 516 and multiple storage devices 518, such as solid state drives (SSD), magnetic disk drives, or other types of mass storage devices.

SAS controllers 512 and SAS expanders 516 are connected via SAS cables 520, 522, 524, 526, 528, 530, 532, and 534. In the illustrated embodiment, each storage device 518 is connected to a pair of SAS expanders 516 via a respective pair of cables 536. As depicted by numbers '1', '2', and 3 on storage devices 518, each storage device is logically associated with a separate zone of storage devices. Rack architecture 500 is merely exemplary of one type of SAS cabling configuration, as other SAS cabling configurations may be implemented.

Generally, the use of SAS controllers, expanders, and cables represent additional costs that quickly add up when scaled across large compute environments, such as data centers and the like. They also represent additional components that statistically are likely to increase the failure rate of compute or storage resource in which these SAS components are installed. As discussed above, miswired SAS cables may also lead to problems.

Figure 6:
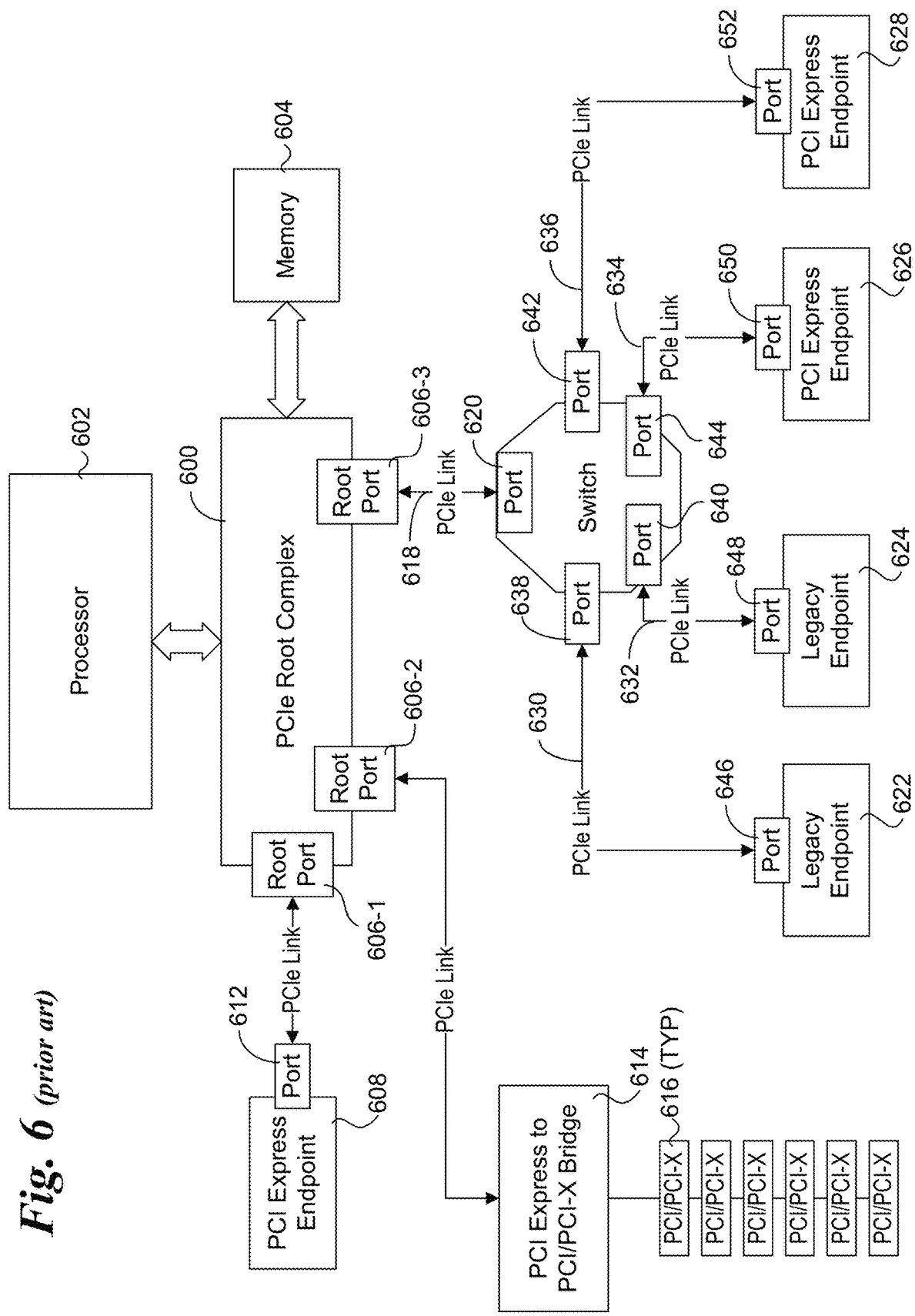
FIG. 6 is a schematic block diagram illustrating the point-to-point, hierarchical architecture employed by Peripheral Component Interconnect (PCI) and PCI Express (PCIe)

According to an aspect of some embodiments, SAS cabling is replaced, in part, with fabric links and PCIe links. PCIe fundamentally employs a point-to-point and hierarchical topology. As shown in FIG. 6, the PCIe architecture includes in a PCIe Root Complex (RC) 600 coupled to a processor 602 and memory 604. The PCIe RC 600 is depicted as including three Root Ports 606-1, 606-2, and 606-3. Root Port 606-1 is connected to a PCI Express endpoint 608 via a PCIe link 610 and a PCIe port 612. Root Port 606-2 is connected to a PCI Express to PCI/PCI-X bridge 614, which is used as an interface between PCIe and a plurality of PCI/PCI-X devices 616. Root Port 606-3 is connected to a switch 616 via a PCIe link 618 and a PCIe port 620. Switch 616 is depicted as connected to a pair of legacy endpoints 622 and 624, and a pair of PCI Express endpoints 626 and 628. These connections are facilitated by PCIe links 630, 632, 634 and 636, and ports 638, 640, 642, 644, 646, 648, 650, and 652.

A Root Complex denotes the root of an IO (Input/Output) hierarchy that connects the CPU/memory subsystem to the 10. As illustrated in FIG. 6, a Root Complex may support one or more PCI Express Ports. Each interface defines a separate hierarchy domain. Each hierarchy domain may be composed of a single Endpoint or a sub-hierarchy containing one or more Switch components and Endpoints. A Root Complex may optionally support routing of peer-to-peer transactions between hierarchy domains.

Endpoint refers to a type of Function that can be the Requester or Completer of a PCI Express transaction either on its own behalf or on behalf of a distinct non-PCI Express device (other than a PCI device or Host CPU), e.g., a PCI Express attached graphics controller or a PCI Express-USB host controller. Endpoints are classified as either legacy, PCI Express, or Root Complex Integrated Endpoints.

PCIe supports a point-to-point interconnect using serial links made up of one or more lanes for each of transmission and receiving data. A PCIe link has at least one lane—each lane represents a set of differential signal pairs (one pair for transmission, one pair for reception). To scale bandwidth, a link may aggregate multiple lanes denoted by xN where N may be any of the supported link widths. For example, as of the PCIe 3.0 specification, PCIe links include operations for ×1, ×2, ×4, ×8, ×12, ×16, and ×32 lane widths. (As used herein, PCIe specification shall refer to the PCIe 3.2 and later specifications, as applicable.) During hardware initialization, each PCI Express link is set up following a negotiation of lane widths and frequency of operation by the two agents at each end of the link. The PCIe protocol also supports enumeration of the PCIe hierarchy, including PCIe devices, bridges, and interfaces in the PCIe hierarchy.

Figure 7:
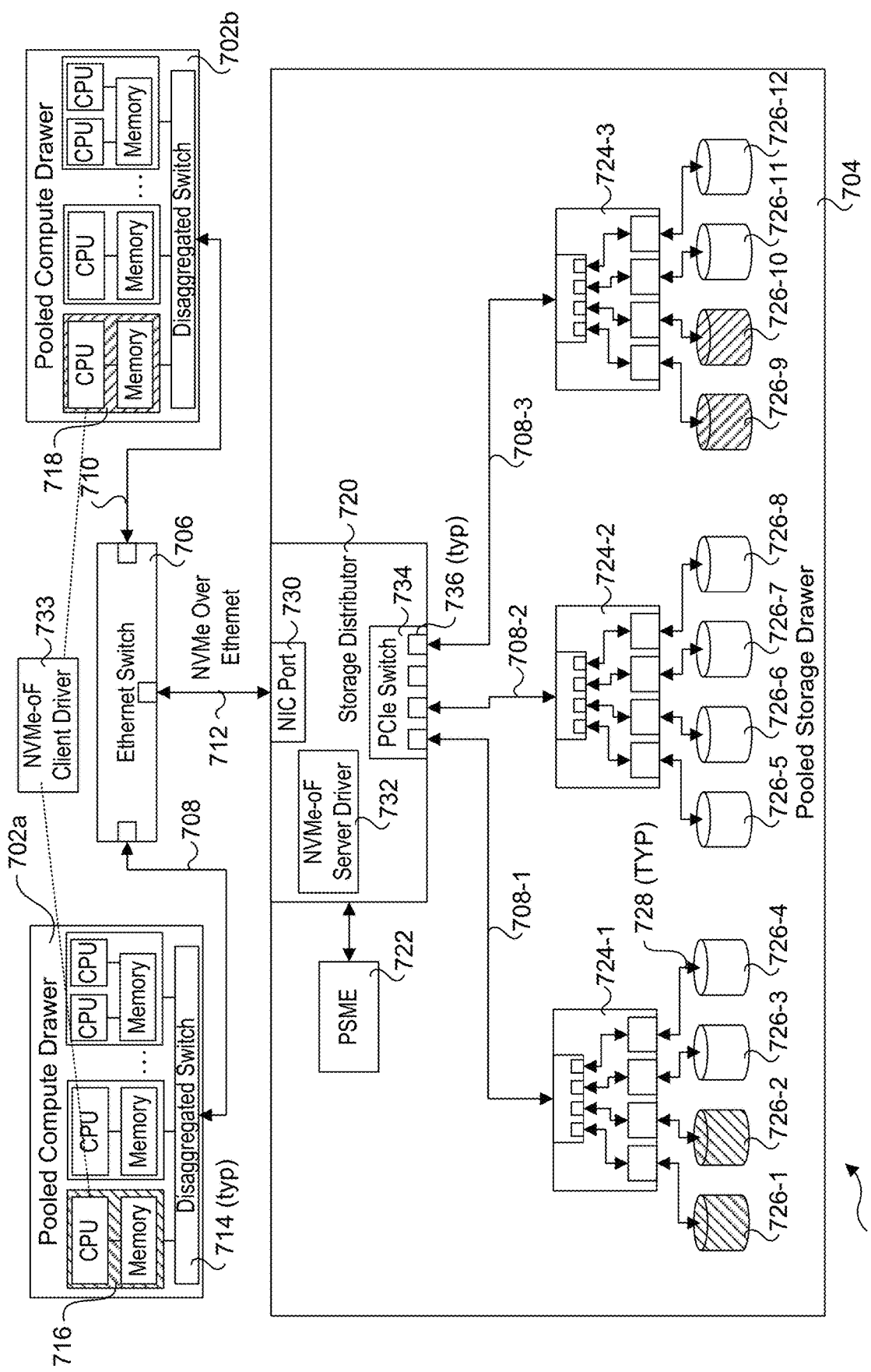
FIG. 7 is a schematic diagram illustrating a rack architecture including compute nodes in pooled compute drawers connected to a pooled storage drawer via Ethernet, wherein the pooled storage drawer includes a plurality of storage devices that appear as local NVMe storage devices, according to one embodiment.

FIG. 7 illustrates a rack architecture 700 for providing distributed access to multiple storage devices using Ethernet, according to one embodiment. Rack architecture 700 includes a pair of pooled compute drawers 702a and 702b, coupled to a pooled storage drawer 704 via an Ethernet switch 706 and Ethernet cables 708, 710, and 712 (also referred to as Ethernet links). Each pooled compute drawer 702a and 702b includes multiple compute noes coupled to a disaggregated switch 714, as depicted by servers 716 and 718.

Pooled storage drawer 704 includes a storage distributor 720 coupled to a PSME 722 and a plurality of input-output (IO) hubs 724-1, 724-2, and 724-3. Each IO hub 724-1, 724-2, and 724-3 is coupled to multiple storage devices 726 (depicted as storage devices 726-1 ... 726-12) via respective storage device cables 728, which are also illustrative of storage device connectors, as explained below. Storage Distributor 720 includes an Ethernet NIC port 730, a Non-volatile memory Express over fabric (NVMe-oF) server driver 732, and a PCIe port 734 having multiple PCIe ports 736 that are coupled to (IO) hubs 724-1, 724-2, and 724-3 via respective cables 738-1, 738-2, and 738-3. As further shown, NVME-OF server driver 732 operates in conjunction with an NVMe-oF client driver 33 running in an operating system (OS) on compute nodes 716 and 718.

In one embodiment, storage devices 726 are Serial ATA (SATA) drives, and device cables 728 are SATA cables or SATA connectors. In a second embodiment, storage devices 726 are PCIe storage devices, and device cables 728 are PCIe cables or PCIe connectors. In a third embodiment, device cables 728 are SATA Express cables or connectors, and storage devices 726 may be either SATA drives, PCIe storage devices, or a mixture of the two. In yet another embodiment, storage devices 726 are SAS devices and device cables 728 are SAS cables or SAS connectors.

As further illustrated in FIG. 7, compute platforms, which include compute resources (CPU, memory) coupled to storage resources, may be composed in a manner that allocates one or more storage devices, or storage portions thereof, to corresponding compute nodes. For example, compute node 716 has been allocated storage devices 726-1 and 726-2, while compute node 718 has been allocated storage devices 726-9 and 726-10. In the illustrated embodiment, PSME 722 interacts with a POD manager (not shown) and NVMe-oF server driver 732 to map compute nodes with storage units, wherein a storage unit may be an entire storage device, or a storage region within a storage device. In addition, the NVMe-oF client and server drivers operate as an abstracted interface that makes it appear from the perspective of an OS running on a compute node that one or more storage devices 726 that are allocated for the compute node are directly coupled to the compute node as a local NVMe storage device.

Figure 7A:
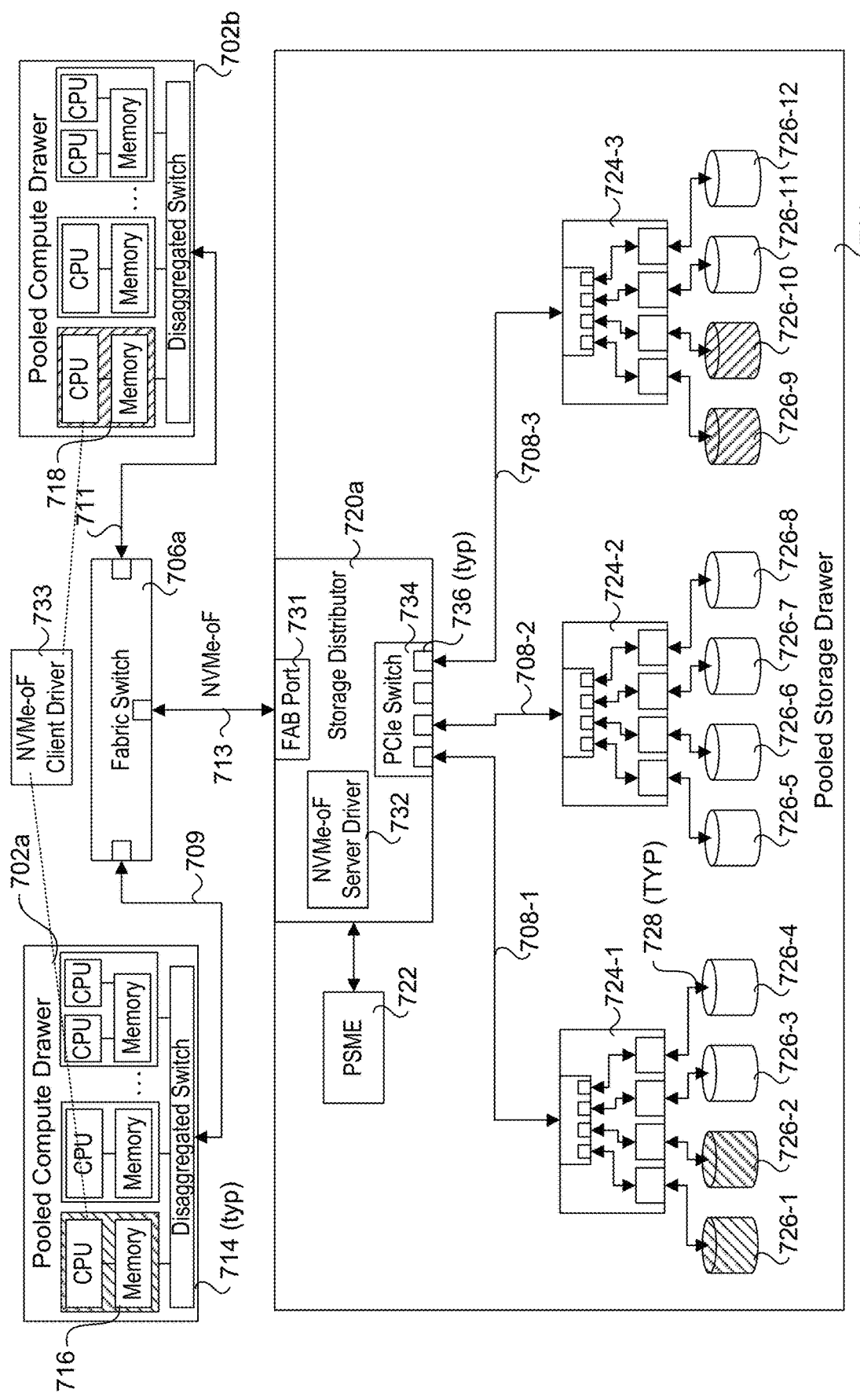
FIG. 7a is a schematic diagram illustrating a generalized configuration similar to the rack architecture of FIG. 7, wherein the Ethernet components have been replaced with associated fabric components.

FIG. 7*a* shows a rack architecture 700*a* for providing distributed access to multiple storage devices via fabric infrastructure, according to one embodiment. Generally, rack architectures 700 and 700*a* are similar, except the Ethernet components have been replaced with corresponding generic fabric components. These include a fabric switch 706*a*, fabric cables 709, 711, and 713, and now a storage distributor 720*a* includes a fabric port 731. Generally, any type of existing or future high-speed fabric may be used, including but not limited to InfiniBand, Ethernet, and Fibre Channel, INTEL® OmniPath. (It is noted that the use of Ethernet in FIG. 7 is illustrative of one type of fabric, while rack architecture 700*a* is not fabric-specific).

Figure 7B:
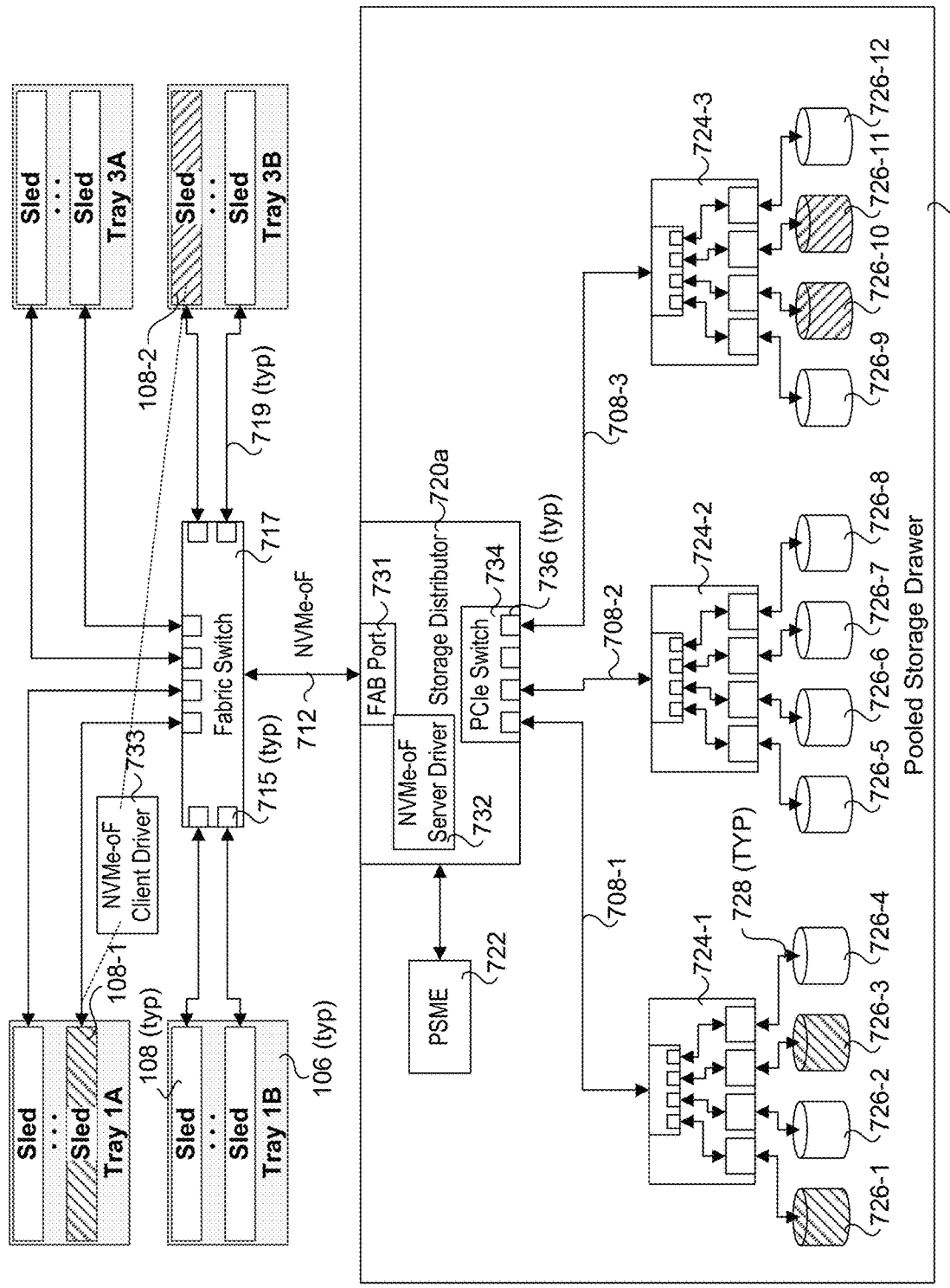
FIG. 7b is a schematic diagram of a rack architecture illustrating a variation of the rack architecture of FIG. 7a under which sleds in trays are connected to a pooled storage drawer via fabric links.

FIG. 7*b* shows a rack architecture 700*b* for providing distributed access to multiple storage devices via fabric infrastructure, wherein the pooled compute drawers 702*a* and 702*b* have been replaced by trays 106 and sleds 108. In one embodiment, trays 106 and sleds 108 are similar to those in FIG. 1 and discussed above. Sleds 106, which are a type of compute node may also be used in pooled compute drawers. As further shown, each of sleds 106 is connected to a respective port 715 in a fabric switch 717 via a respective fabric cable 719. As further illustrated, a sled 108-1 has been allocated storage devices 726-1 and 726-3, while a sled 108-2 has been allocated storage devices 726-10 and 726-11.

Figure 7C:
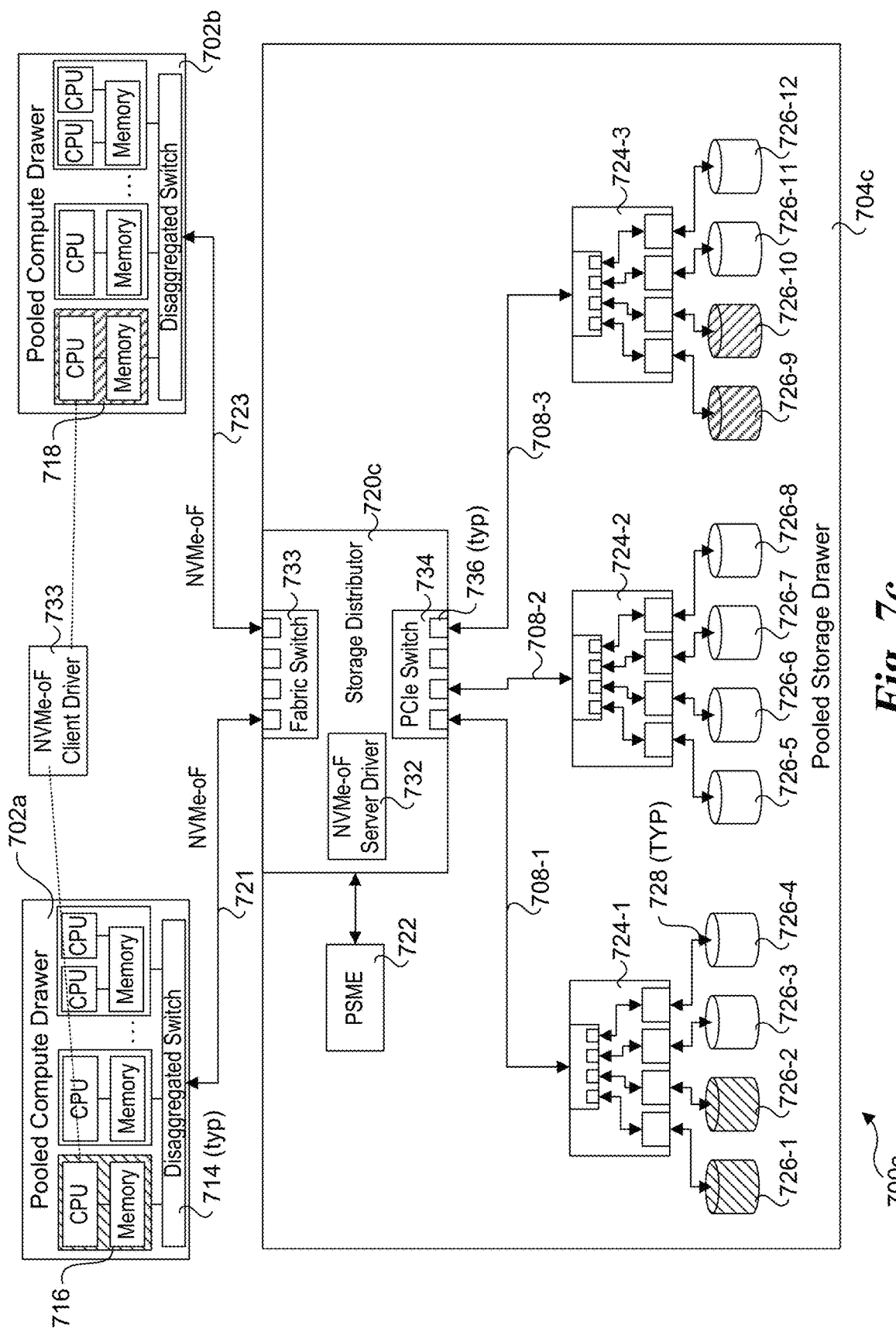
FIG. 7c is a schematic diagram of a rack architecture under which pooled compute drawers are directly coupled to a pooled storage drawer via direct fabric links.

Under rack architecture 700*c* of FIG. 7*c*, the disaggregated switches 714 of pooled compute drawers 702*a* and 702*b* are connected via respective fabric cables 721 and 723 to ports in a fabric switch 733 that is part of a storage distributor 720*c* in a pooled storage drawer 704*c*. This scheme allows compute nodes in a pooled compute drawer to access all storage devices in a pooled storage drawer via a single fabric cable (such as fabric cables 721 and 723) that is dedicated for accessing storage resources. As discussed above, various type of fabrics are supported, including InfiniBand, Ethernet, Fibre Channel, etc. One advantage of this approach is that the communication between a compute node in a pooled compute drawer and a storage device in a pooled storage drawer does not need to traverse a separate fabric switch (e.g., Ethernet switch 706 in FIG. 7, fabric switch 706*a* and 717 in FIGS. 7*a* and 7*b*, respectively).

Figure 7D:
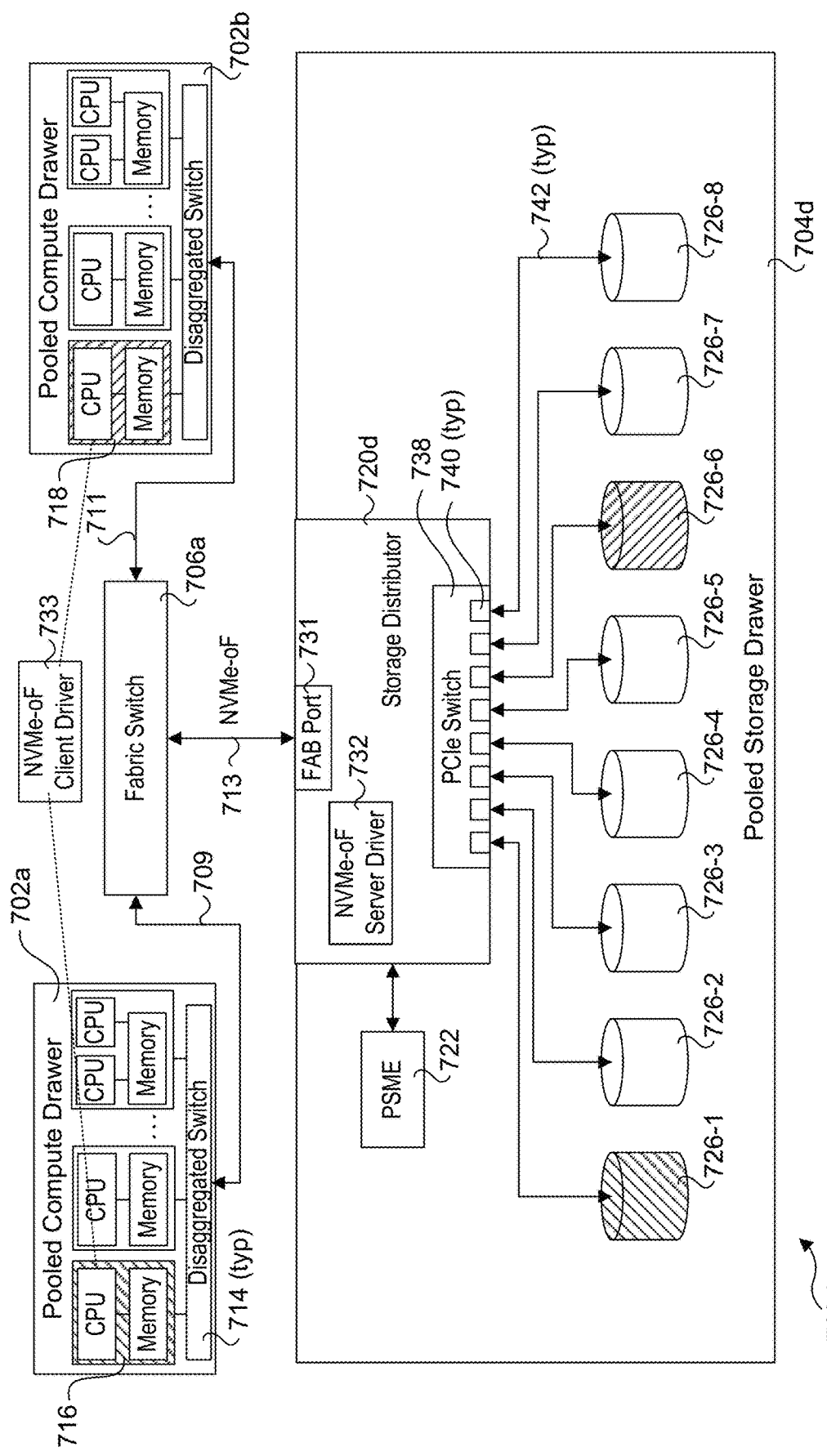
FIG. 7d is a schematic diagram of a rack architecture including a pooled storage drawer in which a storage distributor is directly coupled to a plurality of storage devices, according to one embodiment.

Under rack architecture 700*d* of FIG. 7*d*, the disaggregated switches 714 of pooled compute drawers 702*a* and 702*b* are connected via respective fabric cables 709 and 711 to ports in a fabric switch 706*a* that is coupled to a fabric port 730 in a storage distributor 720*d* in a pooled storage drawer 704*d* via a fabric cable 713. Storage distributor 702*d* includes a PCIe switch 738 having 8 ports 740. Each port 740 is connected to a respective PCIe storage device 726 via a respective cable or connector 742. As further illustrated, compute node 716 has been allocated PCIe storage device 726-1, while compute node 718 has been allocated PCIe storage device 726-6.

Figure 7E:
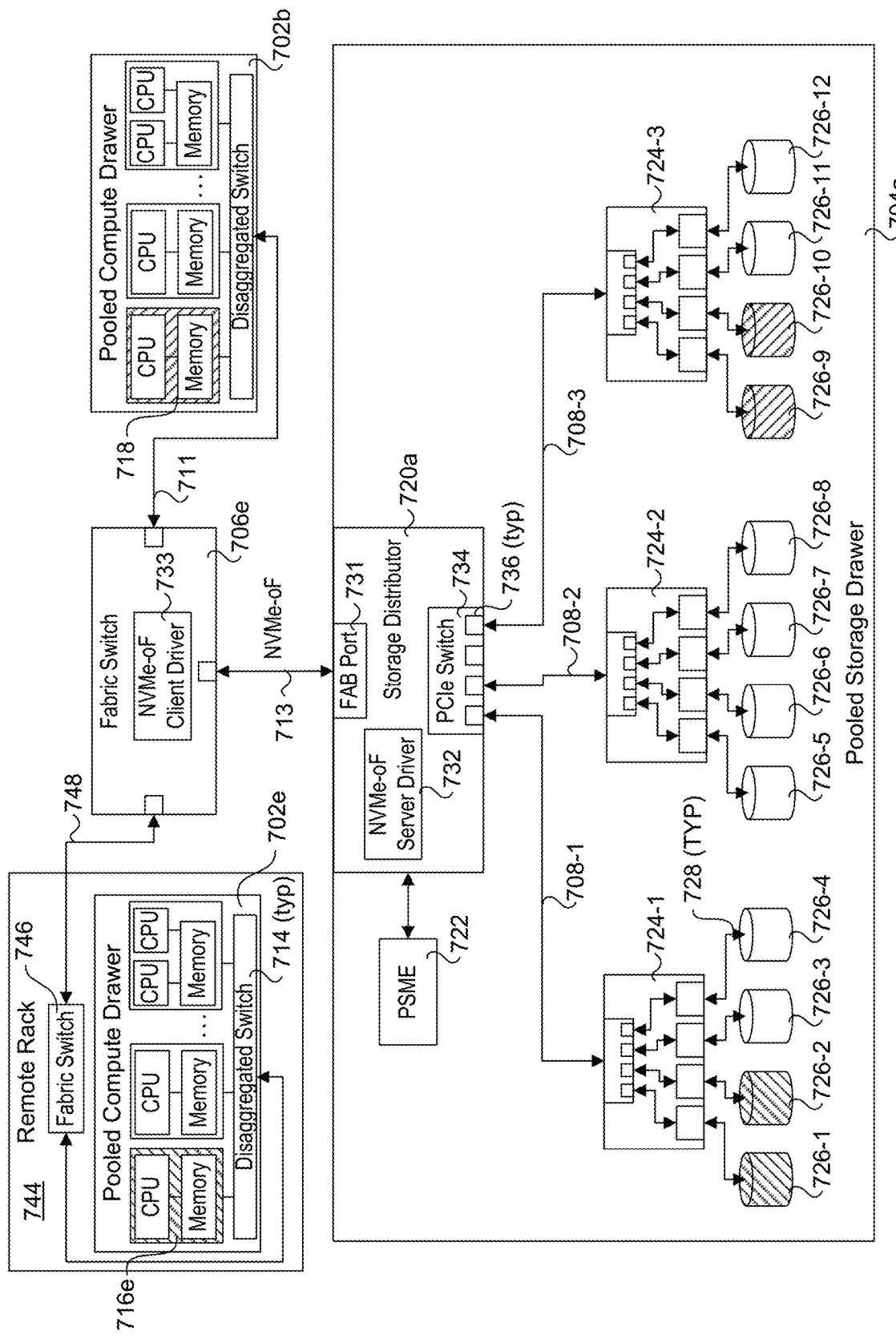
FIG. 7e is a schematic diagram of a rack architecture including a pooled storage drawer in which a storage distributor is directly coupled to a plurality of storage devices, and an NVMe-oF client driver is implemented in a fabric switch, according to one embodiment.

In addition to implementing NVMe-oF client drivers in operating systems running on compute nodes, and NVMe-oF client driver can be implemented in a fabric switch in a manner that enables compute nodes both within the same rack or in another rack (referred to as a remote rack) to access storage devices in a pooled storage drawer. An example of this is illustrated in rack architecture 700*e* of FIG. 7*e*. Rack architecture 700*e* is similar to rack architecture 700*a* of FIG. 7*a*, except now NVMe-oF driver 733 is located in a fabric switch 706*e* to which a pooled compute drawer 702*e* in a remote rack 744 is coupled via a fabric switch 746 in the remote rack and a fabric link 748. Optionally, the communication path may traverse a ToR switch in both the remote and local racks (not shown).

Figure 7F:
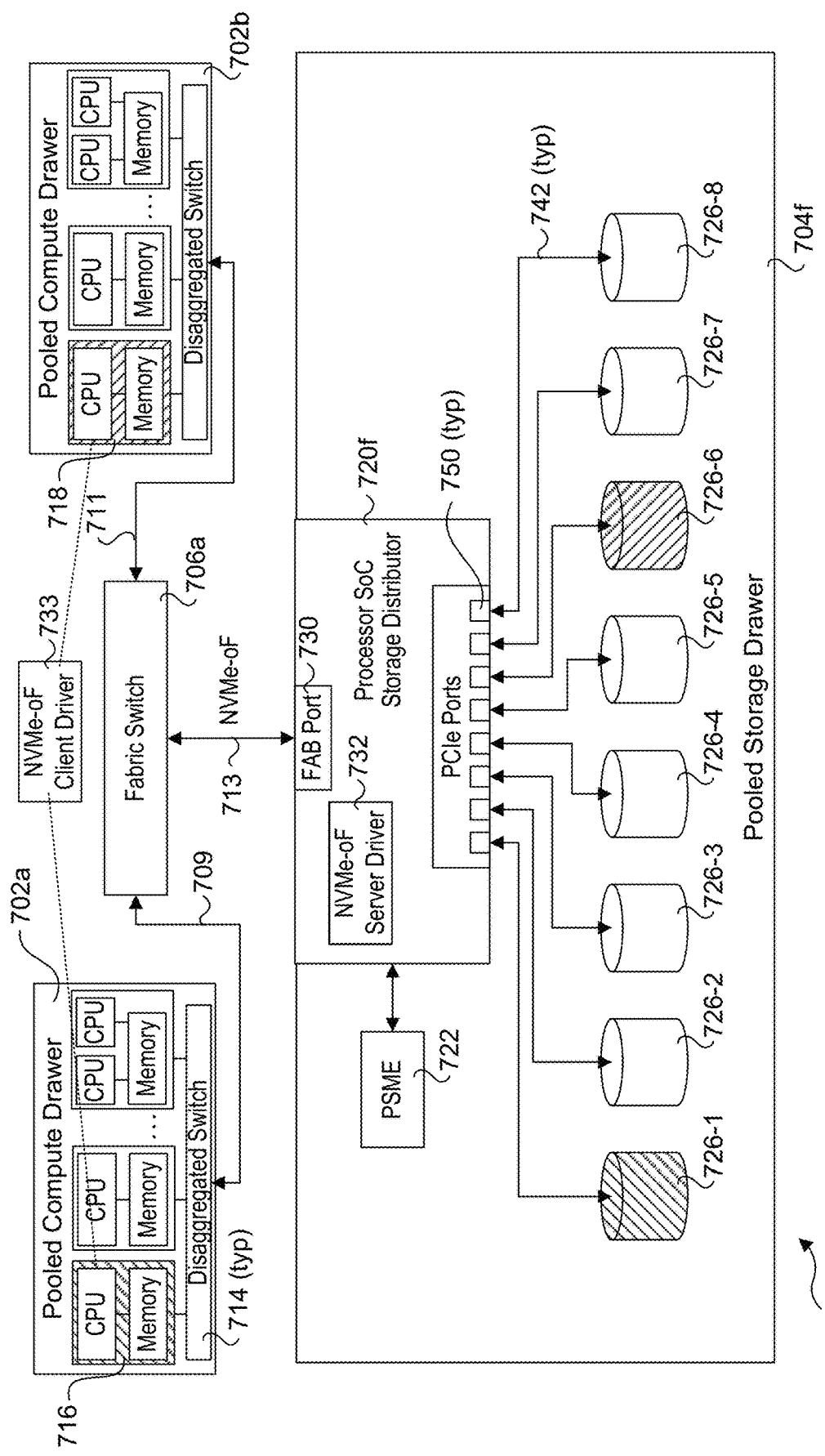
FIG. 7f is a schematic diagram of a rack architecture including a pooled storage drawer in which a storage distributor comprising a processor SoC is directly coupled to a plurality of storage devices via its PCIe ports, according to one embodiment.

In some embodiments, a processor SoC is implemented as a storage distributor. For example, FIG. 7*f* shows a rack architecture 700*f* including a pooled storage drawer 704*f* including a storage distributor 702*f* comprising a processor SoC. The processor SoC including a plurality of PCIe ports 750 connected to respective PCIe storage devices 766-1 . . . 726-8. In a similar manner to that shown in FIG. 7*f*, a processor SoC may be implemented for the storage distributors 720*a*, 720*b*, and 720*e* shown in FIGS. 7*a*, 7*b*, and 7*e*, respectively.

Figure 8A:
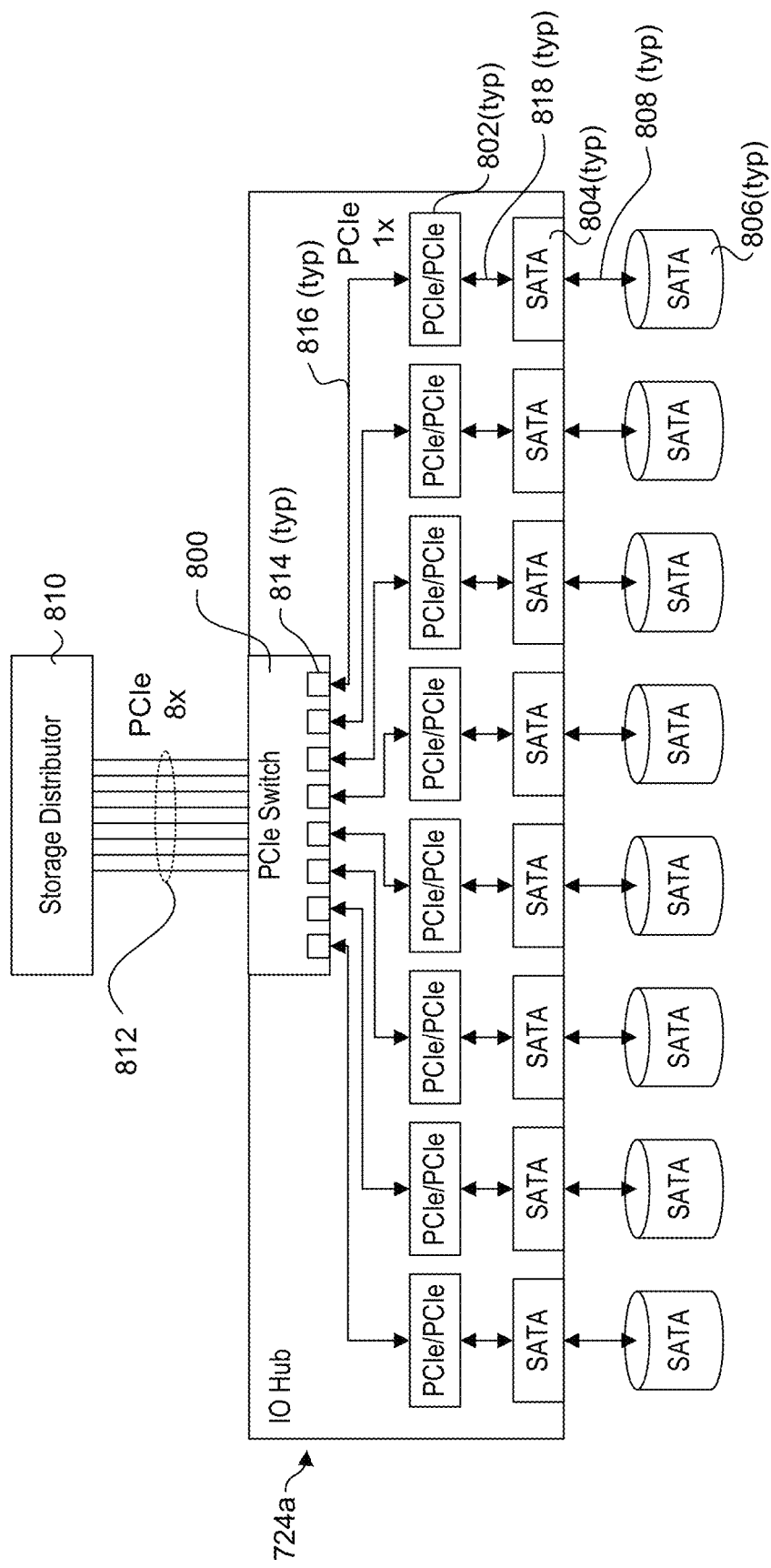
FIG. 8a is a schematic diagram illustrating a first embodiment of an IO hub connected to a plurality of SATA drives.

FIGS. 8*a*, 8*b*, 8*c*, and 8*d* illustrate respective exemplary configurations for IO hubs 724 and their attached storage devices. In FIG. 8*a*, an IO hub 724*a* includes a PCIe switch 800 that is connected to 8 PCIe-to-PCIe (PCIe/PCIe) interfaces 802, each of which is connected to a SATA interface 804. In turn, each SATA interface 804 are connected to a SATA drive 806 via a SATA cable 808. Optionally, a SATA interface 804 includes a built-in SATA connector to which a mating connector on a SATA drive 806 is coupled. In the embodiment illustrated in FIG. 8*a*, PCIe switch 800 is connected to an upstream storage distributor 810 via an 8-lane (8×) PCIe interconnect 812. Meanwhile, each PCIe/PCIe interface 802 is connected to a respective port 814 on PCIe switch 800 via a 1×PCIe interconnect 816.

In one embodiment, PCIe interconnect 816 is a $3^{rd}$ or $4^{th}$ generation PCIe interconnect, and PCIe/PCIe interfaces 802 convert from a PCIe $3^{rd}$ or $4^{th}$ generation to a $2^{nd}$ generation PCIe interface. In turn, interconnects 818 between PCIe/PCIe interfaces 802 and SATA interfaces 804 are $2^{nd}$ generation PCIe interfaces.

The embodiment of FIG. 8*a* is merely exemplary of one IO hub configuration that supports access to SATA drives. In another embodiment supporting access to 4 SATA drives, a 4×PCIe interconnect is used between storage distributor 810 and PCIe switch 800, and PCIe switch 800 is a 4-port PCIe switch connected to 4 PCIe/PCIe interfaces via respective 1×PCIe interconnects.

Figure 8B:
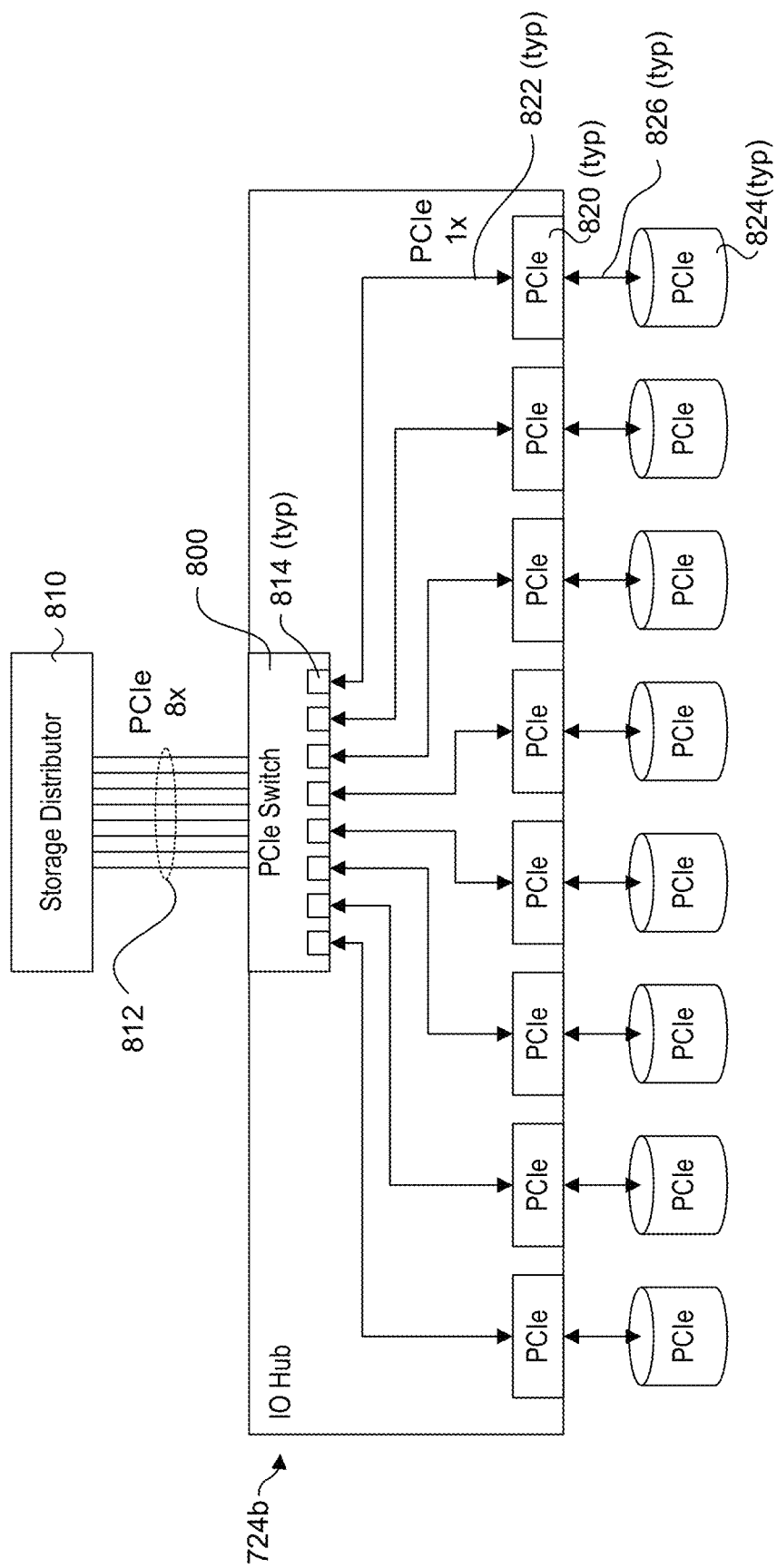
FIG. 8b is a schematic diagram illustrating a second embodiment of an IO hub connected to a plurality of PCIe storage devices.

FIG. 8*b* shows an IO hub 724*b* including a PCIe switch 800 connected to storage distributor 810 via an 8×PCIe interconnect 812. PCIe switch 800 is connected to 8 PCIe interfaces 820 via respective 1×PCIe interconnects 822. Each PCIe interface 820 is connected to a respective PCIe storage device 824 via a respective PCIe cable 826. Optionally, a PCIe interface 820 includes a built-in connector to which a mating connector of a PCIe storage device 824 is coupled. Generally, PCIe storage devices 824 may include any type of storage device with a PCIe interface, including solid-state drives (SSDs), magnetic drives, and NVMe devices.

Figure 8C:
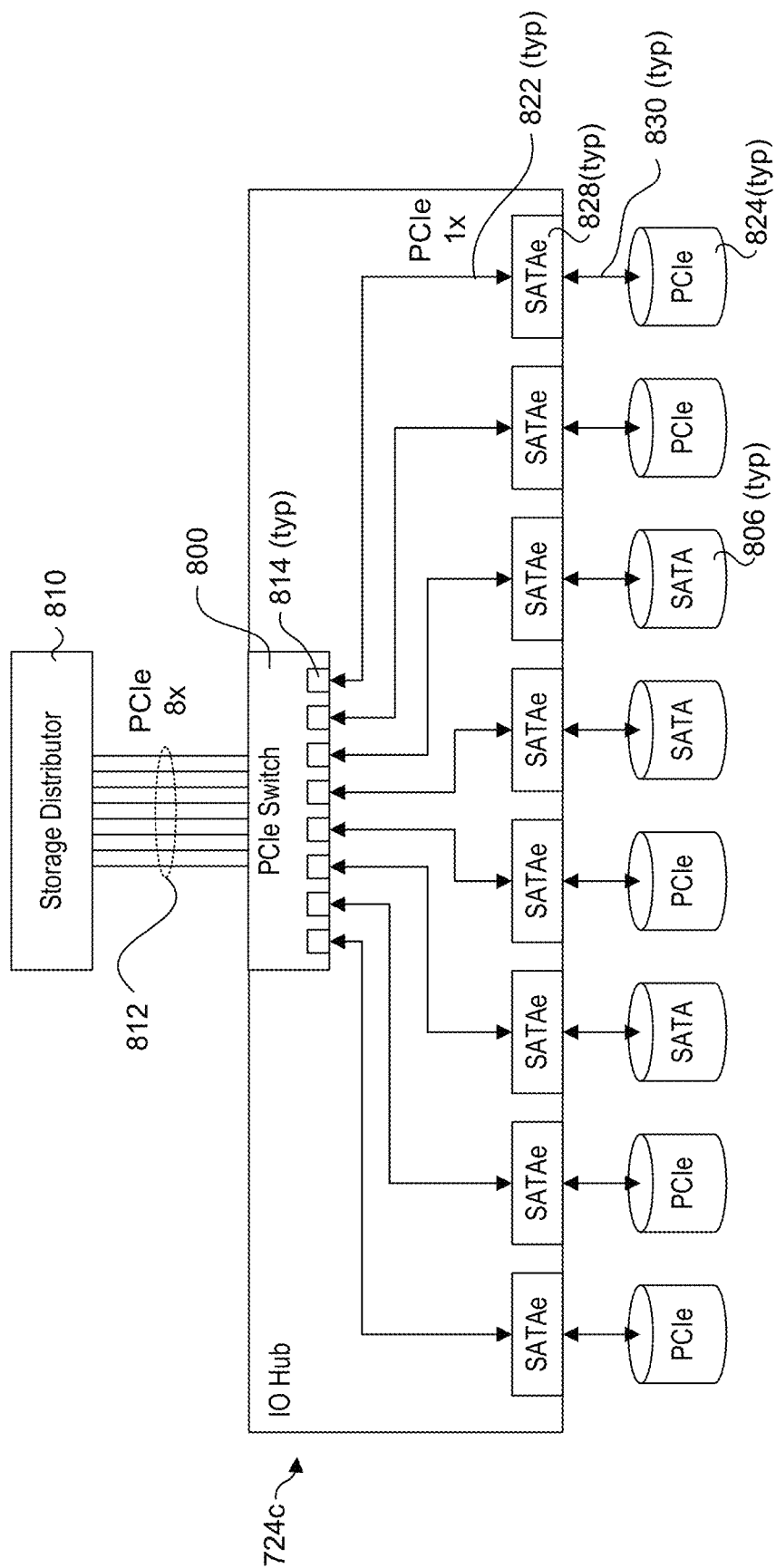
FIG. 8c is a schematic diagram illustrating a third embodiment of an IO hub including SATAe interfaces connected to a plurality of SATA drives and PCIe storage devices.

FIG. 8*c* shows an IO hub 724*c* including a PCIe switch 800 connected to storage distributor 810 via an 8×PCIe interconnect 812. PCIe switch 800 is connected to 8 SATAe interfaces 828 via respective 1×PCIe interconnects 822. SATAe supports connection to both SATA drives and PCIe drives. Accordingly, SATAe interfaces 828 are shown being connected to a mixture of SATA drives 806 and PCIe storage devices 824 via respective SATAe cables 826. Optionally, a SATAe interfaces 828 includes a built-in connector to which a mating connector of a SATA drive 806 or PCIe storage device 824 is coupled.

Figure 8D:
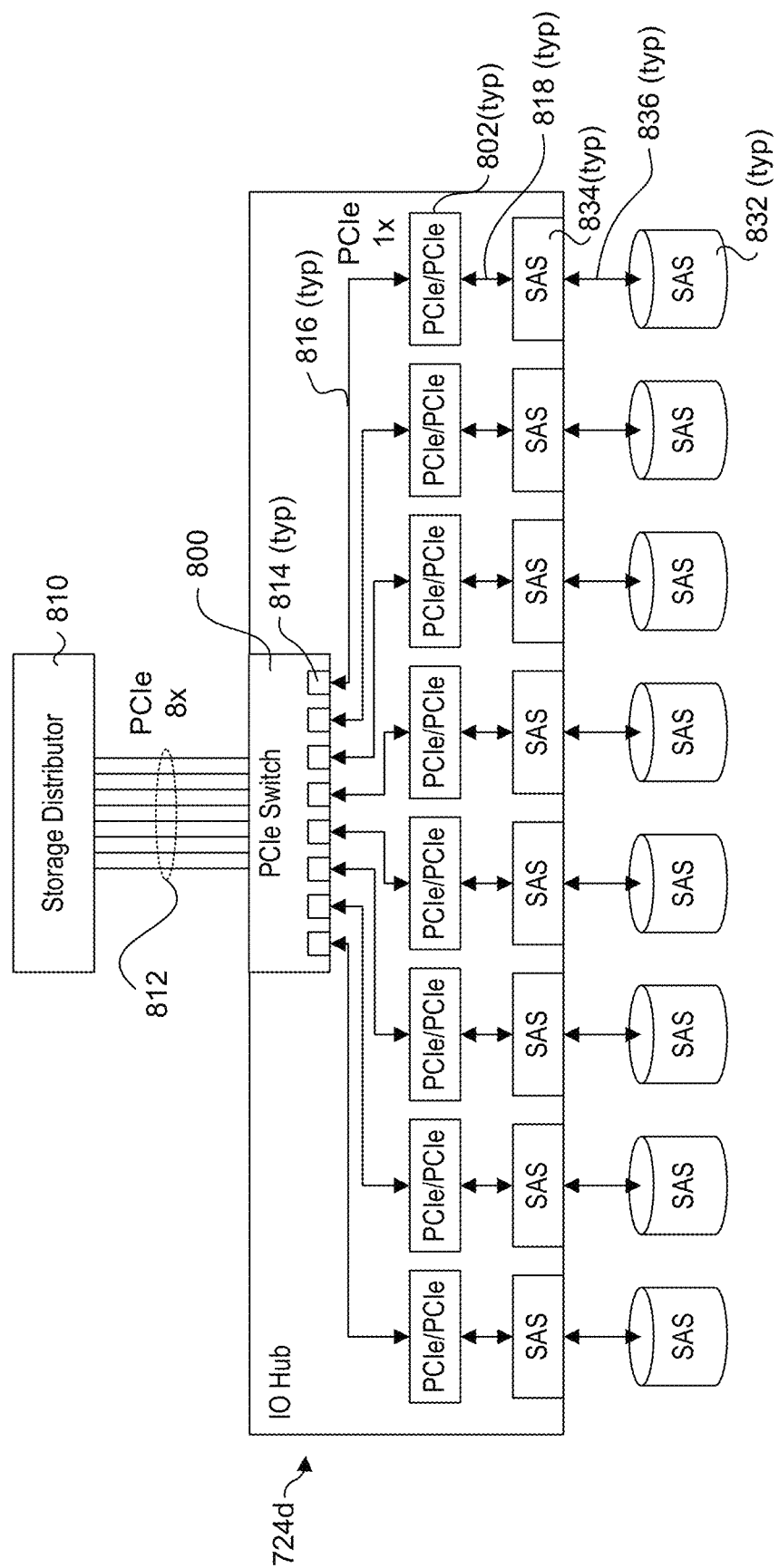
FIG. 8d is a schematic diagram illustrating a fourth embodiment of an IO hub connected to a plurality of SAS drives.

FIG. 8d shows an IO hub 724d that is configured to support access a plurality of SAS drives 832. Generally, the configurations of IO hub 724a of FIG. 8a and IO hub 724d are similar, as depicted by like reference numbers, accept that SATA interfaces 804, SATA drives 806 and SATA cables 808 have been replaced with SAS interfaces 834, SAS drives 832, and SATA cables 836. As before, SAS interfaces 834 may include built-in connectors that are configured to couple to mating connectors in SAS drives 832. In another embodiment (not shown), SAS interfaces are connected to ports of a PCIe switch directly without a PCIe/PCIe interface in a manner similar to the PCIe interfaces 820 in FIG. 8b and the SATAe interfaces 828 in FIG. 8c.

Generally, the IO hubs illustrated herein may be configured in a manner similar to that shown in FIGS. 8a, 8b, 8c, and 8d, or similar circuitry may be integrated in a component that is configured to perform additional functionality. For example, in one embodiment, an INTEL® platform controller hub (PCH) is implemented as an IO hub. INTEL® PCHs include interfaces for coupling a PCH to an upstream component via a PCIe interconnect, and include interfaces for connecting to various types of storage devices, including PCIe interfaces and SATA interfaces.

Generally, the IO hubs illustrated herein may be implemented as a single chip, or via multiple discrete components interconnected in a suitable package. For example, the package may comprise a printed circuit board (PCB) to which multiple chips are mounted, with interconnects formed in layers of the PCB, or in a multichip module using one of several well-known packaging configurations.

As with the IO hub 724a, each of IO hubs 724b, 724c, and 724d may be configured to support access to different numbers of storage devices, and may use different PCIe configurations. In addition, the techniques and principles described and illustrated herein may apply to future generations of PCIe. Moreover, the aspects relating to fabrics may also apply to future fabrics.

The foregoing examples show pooled compute drawers connected to pooled storage drawers. However, this is not limiting, as the techniques and principles described herein may be applied to other types of rack architectures including both conventional and disaggregated rack architectures. The configuration of the pooled compute drawers may also vary, including support for large numbers of lighter-weight modules, such as Intel® Atom®-based server modules.

Figure 9:
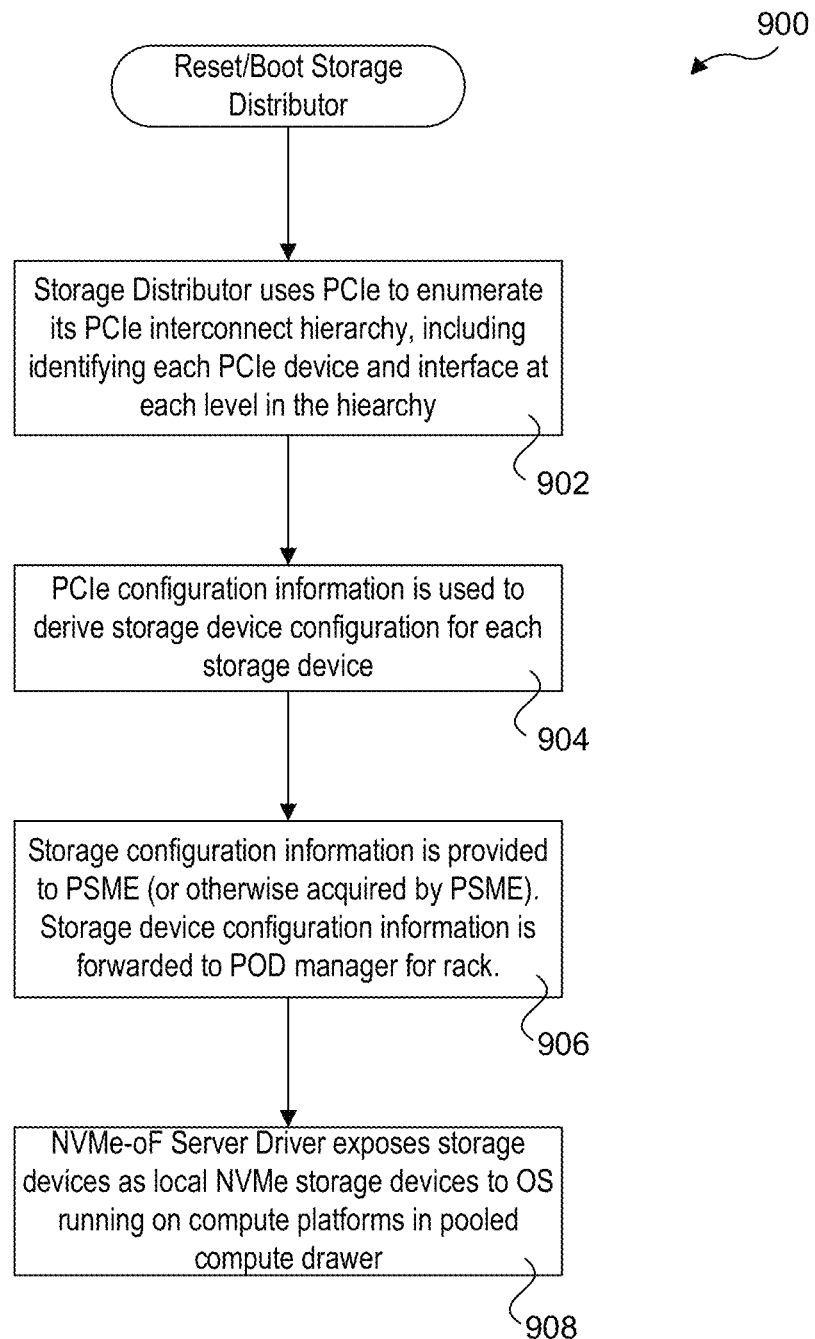
FIG. 9 is a flowchart illustrating operation performed by components in a pooled storage drawer to detect the configuration of the pooled storage drawer in response to a reset or reboot event.

FIG. 9 shows a flowchart 900 illustrating operations performed by components in a pooled storage drawer, according to on embodiment. In response to a storage distributor reset or boot, the storage distributor uses the PCIe protocol to enumerate its PCIe hierarchy, including identifying each PCIe device and PCIe interface at each level in the PCIe hierarchy, as depicted in a block 902. In a block 904, the PCIe configuration information is used to derive storage device configuration information for each storage device, such as which PCIe port a storage device can be accessed through, various performance parameters for the storage device (capacity, speed), type of storage device, etc. In a block 906, the storage configuration information is provided to the storage distributor to the PSME or is otherwise acquired by the PSME. The storage device configuration information is then forwarded by the PSME to the POD manager.

In a block 908, the NVMe-oF driver exposes the storage devices as local NVMe storage devices to the operating systems (OSs) running on the compute nodes. From the perspective of the operating systems, the storage devices in a pooled storage drawer appear to be NVMe devices that are directly coupled to a compute node.

Further aspects of the subject matter described herein are set out in the following numbered clauses:

1. A pooled storage drawer, configured to be installed in a rack in which a plurality of compute nodes and a first fabric switch are installed, comprising:
   a storage distributor including at least one fabric port and a first Peripheral Component Interconnect Express (PCIe) switch having a plurality of PCIe ports; and
   at least one input-output (IO) hub having a PCIe switch coupled to a respective PCIe port on the first PCIe switch and a plurality of storage device interfaces;
   wherein the storage distributor is configured, during operation when the pooled storage drawer is installed in the rack and a plurality of storage devices are respectively coupled to the plurality of storage device interfaces, to determine a configuration of the plurality of storage devices and expose access to the plurality of storage devices to operating systems running on the compute nodes as if the storage devices are local to the compute nodes.

2. The pooled storage drawer of clause 1, wherein the storage distributor implements a Non-volatile Memory Express over Fabric (NVMe-oF) server driver that is configured to enable access to the plurality of storage devices using an NVMe-oF protocol transmitted over a fabric link coupled to the fabric port when the pooled storage drawer is installed in the rack and a plurality of storage devices are respectively coupled to the plurality of storage device interfaces.

3. The pooled storage drawer of clause 2, wherein the NVMe-oF server driver is configured to interact with NVMe-oF client drivers running on the compute nodes.

4. The pooled storage drawer of clause 2 or 3, wherein at least a portion of the storage devices comprise NVMe-oF devices.

5. The pooled storage drawer of any of clauses 2-4, wherein at least a portion of the storage devices are not NVMe-oF devices.

6. The pooled storage drawer of clause 1, wherein the plurality of storage devices are Serial ATA (SATA) drives, and the plurality of storage device interfaces include at least one of SATA interfaces and SATA Express interfaces.

7. The pooled storage drawer of clause 1, wherein the plurality of storage device interfaces are Serial ATA Express (SATAe) interfaces.

8. The pooled storage drawer of any of the preceding clauses, wherein the at least one IO hub comprises a platform controller hub (PCH).

9. The pooled storage drawer of clause 1, wherein the plurality of storage devices are Serial Attached SCSI (SAS) drives, and the plurality of storage device interfaces are SAS interfaces.

10. The pooled storage drawer of any of the preceding clauses, wherein the at least one IO hub further comprises a plurality of respective PCIe-to-PCIe (PCIe/PCIe) interfaces coupled between a plurality of ports on the PCIe switch and the plurality of storage device interfaces, wherein the PCIe/PCIe interfaces are configured to convert PCIe signals from one generation of PCIe signals to another generation of PCIe signals.

11. The pooled storage drawer of any of the preceding clauses, wherein the fabric comprises an Ethernet fabric.

12. A system, comprising:
   a rack;

at least one pooled compute drawer, installed in the rack, each of the at least one pooled compute drawer including a plurality of compute nodes, each compute node including a central processing unit and memory, and running at least one instance of an operating system;

a pooled storage drawer, installed in a rack, including, a storage distributor including at least one of a fabric port and a first Peripheral Component Interconnect Express (PCIe) switch having a plurality of PCIe ports;

at least one input-output (IO) hub, each IO hub having a PCIe switch coupled to a respective PCIe port on the first PCIe switch and a plurality of storage device interfaces; and a plurality of storage devices respectively coupled to the plurality of storage device interfaces; and means for communicatively coupling at least a portion of the compute nodes to the pooled storage drawer, said means including one or more fabric links including at least one fabric link coupled to at least one fabric port in the storage distributor, wherein the storage distributor is configured, during operation, to determine a configuration of the plurality of storage devices and expose access to the plurality of storage devices to operating systems running on the compute nodes as if the storage devices are local to the compute nodes.

13. The system of clause 12, wherein the storage distributor implements a Non-volatile Memory Express over Fabric (NVMe-oF) server driver that is configured to enable access to the plurality of storage devices using an NVMe-oF protocol transmitted over the one or more fabric links, and wherein an operating system running on a compute node includes an NVMe-oF client driver that interacts with the NVMe-oF server driver to enable the operating system to access the plurality of storage devices.

14. The system of clause 13, wherein at least a portion of the storage devices comprise NVMe-oF devices.

15. The system of clause 13 or 14, wherein at least a portion of the storage devices are not NVMe-oF devices.

16. The system of any of clauses 13-15, wherein the plurality of storage devices are Serial ATA (SATA) drives, and the plurality of storage device interfaces include at least one of SATA interfaces and SATA Express interfaces.

17. The system of any of clauses 13-16, wherein the plurality of storage device interfaces are Serial ATA Express (SATAe) interfaces.

18. The system of any of clauses 13-17, wherein the at least one IO hub comprises a platform controller hub (PCH).

19. The system of any of clauses 13-18, wherein the plurality of storage devices are Serial Attached SCSI (SAS) drives, and the plurality of storage device interfaces are SAS interfaces.

20. The system of any of clauses 13-19, wherein the at least one IO hub further comprises a plurality of respective PCIe-to-PCIe (PCIe/PCIe) interfaces coupled between a plurality of ports on the PCIe switch and the plurality of storage device interfaces, wherein the PCIe/PCIe interfaces are configured to convert PCIe signals from one generation of PCIe signals to another generation of PCIe signals.

21. A pooled storage drawer, configured to be installed in a rack in which a plurality of compute nodes, a fabric, and a fabric switch are installed and to which a plurality of Peripheral Component Interconnect Express (PCIe) storage devices are to be connected, comprising:

a storage distributor including,
a fabric port;
a Peripheral Component Interconnect Express (PCIe) switch having a plurality of PCIe ports to which respective PCIe storage devices are coupled; and a Non-volatile Memory Express over Fabric (NVMe-oF) server driver that is configured to enable access to the plurality of PCIe storage devices using an NVMe-oF protocol transmitted over a fabric link coupled to the fabric port when the pooled storage drawer is installed in the rack with the plurality of storage devices connected.

22. The pooled storage drawer of clause 21, wherein the NVMe-oF server driver is configured to interact with NVMe-oF client drivers running on the compute nodes.

23. The pooled storage drawer of clause 21 or 22, wherein the NVMe-oF server driver is configured to interact with an NVMe-oF client driver running on the fabric switch.

24. The pooled storage drawer of any of clauses 21-23, wherein the rack includes a rack management entity, further comprising a drawer management entity that is configured to interact with the storage distributor to determine configuration information relating to a configuration of the plurality of PCIe storage devices and forward the configuration information to the rack management entity.

25. The pooled storage drawer of any of clauses 21-24, wherein the plurality of PCIe storage devices are NVMe storage devices.

26. A pooled storage drawer, configured to be installed in a rack in which a plurality of compute nodes and a first fabric switch are installed, comprising:

at least one input-output (TO) hub including,
means for interfacing with a plurality of storage devices; and
means for interfacing with a storage distributor;
the storage distributor, including,
means for interfacing with a fabric;
means for interfacing with the at least one TO hub; and
means for determining, when the pooled storage drawer is installed in the rack and a plurality of storage devices are coupled to the at least one TO hub, a configuration of the plurality of storage devices and means for exposing access to the plurality of storage devices to operating systems running on the compute nodes as if the storage devices are local to the compute nodes.

27. The pooled storage drawer of clause 26, wherein the storage distributor further includes means for enabling access to the plurality of storage devices using Non-volatile Memory Express over fabric (NVMe-oF) protocol.

28. The pooled storage drawer of clause 27, wherein the storage distributor further includes means for interacting with NVMe-oF client drivers running on the compute nodes.

29. The pooled storage drawer of clause 27 or 28, wherein at least a portion of the storage devices comprise NVMe-oF devices.

30. The pooled storage drawer of any of clauses 27-29, wherein at least a portion of the storage devices are not NVMe-oF devices.

31. The pooled storage drawer of clause 26, wherein the plurality of storage devices are Serial ATA (SATA) drives, and the means for interfacing with the plurality of storage devices includes at least one of SATA interfaces and SATA Express interfaces.

32. The pooled storage drawer of any of clause 26-31, wherein the at least one TO hub comprises a platform controller hub (PCH).

33. The pooled storage drawer of clause 26, wherein the plurality of storage devices are Serial Attached SCSI (SAS) drives, and the means for interfacing with the plurality of storage devices are SAS interfaces.

34. The pooled storage drawer of any of clauses 26-33, wherein the fabric comprises an Ethernet fabric, and the means for means for interfacing with the fabric comprises an Ethernet Port.

35. The pooled storage drawer of any of clauses 26-34, wherein the storage distributor comprises a processor System on a Chip (SoC).

36. A pooled storage drawer, configured to be installed in a rack in which a plurality of compute nodes, a fabric, and a fabric switch are installed and to which a plurality of Peripheral Component Interconnect Express (PCIe) storage devices are to be connected, comprising:
 a storage distributor including,
 means for interfacing to the fabric;
 means for connecting to the plurality of PCIe storage devices; and
 means for enabling access to the plurality of PCIe storage devices using a Non-volatile Memory express over Fabric (NVMe-oF) protocol transmitted over a fabric link coupled to the means for interfacing to the fabric when the pooled storage drawer is installed in the rack with the plurality of PCIe storage devices connected.

37. The pooled storage drawer of clause 36, wherein the means for enabling access to the plurality of PCIe storage devices using the NVMe-oF protocol is configured to interact with NVMe-oF client drivers running on the compute nodes.

38. The pooled storage drawer of clause 36 or 37, wherein the means for enabling access to the plurality of PCIe storage devices using the NVMe-oF protocol is configured to interact with an NVMe-oF client driver running on the fabric switch.

39. The pooled storage drawer of any of clauses 36-38, wherein the rack includes a rack management entity, further comprising a drawer management entity that is configured to interact with the storage distributor to determine configuration information relating to a configuration of the plurality of PCIe storage devices and forward the configuration information to the rack management entity.

40. The pooled storage drawer of any of clauses 36-39, wherein the plurality of PCIe storage devices are NVMe storage devices.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As discussed above, various aspects of the embodiments herein may be facilitated by corresponding software and/or firmware components and applications, such as software and/or firmware executed by an embedded processor or the like. Thus, embodiments of this invention may be used as or to support a software program, software modules, firmware, and/or distributed software executed upon some form of processor, processing core or embedded logic a virtual machine running on a processor or core or otherwise implemented or realized upon or within a computer-readable or machine-readable non-transitory storage medium. A computer-readable or machine-readable non-transitory storage medium includes any mechanism for storing or transmitting information in a form readable by a machine (e.g., a computer). For example, a computer-readable or machine-readable non-transitory storage medium includes any mechanism that provides (i.e., stores and/or transmits) information in a form accessible by a computer or computing machine (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A computer-readable or machine-readable non-transitory storage medium may also include a storage or database from which content can be downloaded. The computer-readable or machine-readable non-transitory storage medium may also include a device or product having content stored thereon at a time of sale or delivery. Thus, delivering a device with stored content, or offering content for download over a communication medium may be understood as providing an article of manufacture comprising a computer-readable or machine-readable non-transitory storage medium with such content described herein.

Various components referred to above as processes, servers, or tools described herein may be a means for performing the functions described. The operations and functions performed by various components described herein may be implemented by software running on a processing element, via embedded hardware or the like, or any combination of hardware and software. Such components may be implemented as software modules, hardware modules, specialpurpose hardware (e.g., application specific hardware, ASICs, DSPs, etc.), embedded controllers, hardwired circuitry, hardware logic, etc. Software content (e.g., data, instructions, configuration information, etc.) may be provided via an article of manufacture including computer-readable or machine-readable non-transitory storage medium, which provides content that represents instructions that can be executed. The content may result in a computer performing various functions/operations described herein.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A pooled storage drawer, configured to be installed in a rack in which a plurality of compute nodes and a first fabric switch are installed, comprising:
    a storage distributor including at least one fabric port and a first Peripheral Component Interconnect Express (PCIe) switch having a plurality of PCIe ports; and
    at least one input-output (IO) hub having a PCIe switch coupled to a respective PCIe port on the first PCIe switch and a plurality of storage device interfaces;
    wherein the storage distributor is configured, during operation when the pooled storage drawer is installed in the rack and a plurality of storage devices are respectively coupled to the plurality of storage device interfaces, to determine a configuration of the plurality of storage devices and expose access to the plurality of storage devices to operating systems running on the compute nodes as if the storage devices are local to the compute nodes.

2. The pooled storage drawer of claim 1, wherein the storage distributor implements a Non-volatile Memory Express over Fabric (NVMe-oF) server driver that is configured to enable access to the plurality of storage devices using an NVMe-oF protocol transmitted over a fabric link coupled to the fabric port when the pooled storage drawer is installed in the rack and a plurality of storage devices are respectively coupled to the plurality of storage device interfaces.

3. The pooled storage drawer of claim 2, wherein the NVMe-oF server driver is configured to interact with NVMe-oF client drivers running on the compute nodes.

4. The pooled storage drawer of claim 2, wherein at least a portion of the storage devices comprise NVMe-oF devices.

5. The pooled storage drawer of claim 2, wherein at least a portion of the storage devices are not NVMe-oF devices.

6. The pooled storage drawer of claim 1, wherein the plurality of storage devices are Serial ATA (SATA) drives, and the plurality of storage device interfaces include at least one of SATA interfaces and SATA Express interfaces.

7. The pooled storage drawer of claim 1, wherein the plurality of storage device interfaces are Serial ATA Express (SATAe) interfaces.

8. The pooled storage drawer of claim 1, wherein the at least one IO hub comprises a platform controller hub (PCH).

9. The pooled storage drawer of claim 1, wherein the plurality of storage devices are Serial Attached SCSI (SAS) drives, and the plurality of storage device interfaces are SAS interfaces.

10. The pooled storage drawer of claim 1, wherein the at least one IO hub further comprises a plurality of respective PCIe-to-PCIe (PCIe/PCIe) interfaces coupled between a plurality of ports on the PCIe switch and the plurality of storage device interfaces, wherein the PCIe/PCIe interfaces are configured to convert PCIe signals from one generation of PCIe signals to another generation of PCIe signals.

11. The pooled storage drawer of claim 1, wherein the fabric comprises an Ethernet fabric.

12. A system, comprising:
    a rack;
    at least one pooled compute drawer, installed in the rack, each of the at least one pooled compute drawer including a plurality of compute nodes, each compute node including a central processing unit and memory, and running at least one instance of an operating system;
    a pooled storage drawer, installed in a rack, including,
        a storage distributor including at least one of a fabric port and a first Peripheral Component Interconnect Express (PCIe) switch having a plurality of PCIe ports;
        at least one input-output (TO) hub, each IO hub having a PCIe switch coupled to a respective PCIe port on the first PCIe switch and a plurality of storage device interfaces; and
        a plurality of storage devices respectively coupled to the plurality of storage device interfaces; and
    means for communicatively coupling at least a portion of the compute nodes to the pooled storage drawer, said means including one or more fabric links including at least one fabric link coupled to at least one fabric port in the storage distributor,
    wherein the storage distributor is configured, during operation, to determine a configuration of the plurality of storage devices and expose access to the plurality of storage devices to operating systems running on the compute nodes as if the storage devices are local to the compute nodes.

13. The system of claim 12, wherein the storage distributor implements a Non-volatile Memory Express over Fabric (NVMe-oF) server driver that is configured to enable access to the plurality of storage devices using an NVMe-oF protocol transmitted over the one or more fabric links, and wherein an operating system running on a compute node includes an NVMe-oF client driver that interacts with the NVMe-oF server driver to enable the operating system to access the plurality of storage devices.

14. The system of claim 13, wherein at least a portion of the storage devices comprise NVMe-oF devices.

15. The system of claim 13, wherein at least a portion of the storage devices are not NVMe-oF devices.

16. The system of claim 12, wherein the plurality of storage devices are Serial ATA (SATA) drives, and the plurality of storage device interfaces include at least one of SATA interfaces and SATA Express interfaces.

17. The system of claim 12, wherein the plurality of storage device interfaces are Serial ATA Express (SATAe) interfaces.

18. The system of claim 12, wherein the at least one IO hub comprises a platform controller hub (PCH).

19. The system of claim 12, wherein the plurality of storage devices are Serial Attached SCSI (SAS) drives, and the plurality of storage device interfaces are SAS interfaces.

20. The system of claim 12, wherein the at least one IO hub further comprises a plurality of respective PCIe-to-PCIe (PCIe/PCIe) interfaces coupled between a plurality of ports on the PCIe switch and the plurality of storage device interfaces, wherein the PCIe/PCIe interfaces are configured to convert PCIe signals from one generation of PCIe signals to another generation of PCIe signals.

21. A pooled storage drawer, to which a plurality of Peripheral Component Interconnect Express (PCIe) storage devices are to be connected, and configured to be installed in a rack in which a plurality of compute nodes, a fabric, and a fabric switch are installed, comprising:
 a storage distributor including,
  a fabric port;
  a Peripheral Component Interconnect Express (PCIe) switch having a plurality of PCIe ports to which respective PCIe storage devices are coupled; and
  a Non-volatile Memory Express over Fabric (NVMe-oF) server driver that is configured to enable access to the plurality of PCIe storage devices using an NVMe-oF protocol transmitted over a fabric link coupled to the fabric port when the pooled storage drawer is installed in the rack with the plurality of storage devices connected.

22. The pooled storage drawer of claim 21, wherein the NVMe-oF server driver is configured to interact with NVMe-oF client drivers running on the compute nodes.

23. The pooled storage drawer of claim 21, wherein the NVMe-oF server driver is configured to interact with an NVMe-oF client driver running on the fabric switch.

24. The pooled storage drawer of claim 21, wherein the rack includes a rack management entity, further comprising a drawer management entity that is configured to interact with the storage distributor to determine configuration information relating to a configuration of the plurality of PCIe storage devices and forward the configuration information to the rack management entity.

25. The pooled storage drawer of claim 21, wherein the plurality of PCIe storage devices are NVMe storage devices.

* * * * *